United States Patent
Kim et al.

(10) Patent No.: US 9,496,520 B2
(45) Date of Patent: Nov. 15, 2016

(54) ORGANIC ELECTRONIC ELEMENT INCLUDING LIGHT EFFICIENCY IMPROVING LAYER, ELECTRONIC DEVICE INCLUDING THE SAME, AND COMPOUND FOR THE SAME

(71) Applicant: DUK SAN NEOLUX CO., LTD., Cheonan-Si, Chungcheongnam-Do (KR)

(72) Inventors: Dongha Kim, Gyeonggi-do (KR); Sunhee Lee, Chungcheongnam-do (KR); (Continued)

(73) Assignee: DUK SAN NEOLUX CO., LTD., Cheonan-Si (KR)

( * ) Notice: Subject to any disclaimer, the term of this patent is extended or adjusted under 35 U.S.C. 154(b) by 250 days.

(21) Appl. No.: 14/385,152

(22) PCT Filed: Feb. 27, 2013

(86) PCT No.: PCT/KR2013/001585
§ 371 (c)(1),
(2) Date: Sep. 13, 2014

(87) PCT Pub. No.: WO2013/137572
PCT Pub. Date: Sep. 19, 2013

(65) Prior Publication Data
US 2015/0069350 A1 Mar. 12, 2015

(30) Foreign Application Priority Data
Mar. 13, 2012 (KR) .................. 10-2012-0025433

(51) Int. Cl.
H01L 51/50 (2006.01)
H01L 51/52 (2006.01)
(Continued)

(52) U.S. Cl.
CPC ........... *H01L 51/5265* (2013.01); *C09K 11/06* (2013.01); *H01L 51/006* (2013.01);
(Continued)

(58) Field of Classification Search
None
See application file for complete search history.

(56) References Cited

U.S. PATENT DOCUMENTS

2008/0254318 A1* 10/2008 Nakashima .......... C07D 209/88
428/690

FOREIGN PATENT DOCUMENTS

KR 10-2007-0089985 A 9/2007
KR 10-2009-0035729 A 4/2009
(Continued)

OTHER PUBLICATIONS

International Search Report for PCT/KR2013/001585.
Written Opinion of the International Searching Authority for PCT/KR2013/001585.

*Primary Examiner* — Gregory Clark
(74) *Attorney, Agent, or Firm* — Vorys, Sater, Seymour & Pease LLP; Mih Suhn Koh

(57) ABSTRACT

An organic electronic element includes a first electrode, a second electrode, one or more organic layers formed between the first electrode and the second electrode, and a light efficiency improving layer formed on at least one of an upper side and a lower side of the first electrode and the second electrode, opposite to the side on which the organic layers are formed, wherein the light efficiency improving layer includes a compound represented by Chemical Formula 1. An electronic device includes a display device including the organic electronic element and a controller for driving the display device.

10 Claims, 2 Drawing Sheets

(72) Inventors: Seongje Park, Busan (KR); Sunpil Hwang, Gyeonggi-do (KR); Seungwon Yeo, Daejeon (KR); Hakyoung Lee, Incheon (KR); Soungyun Mun, Gyeonggi-do (KR); Bumsung Lee, Chungcheongnam-do (KR); Junghwan Park, Seoul (KR)

(51) Int. Cl.
    *C09K 11/06*     (2006.01)
    *H01L 51/00*     (2006.01)
    *H05B 33/10*     (2006.01)

(52) U.S. Cl.
CPC ....... *H01L 51/0052* (2013.01); *H01L 51/0061* (2013.01); *H01L 51/0067* (2013.01); *H01L 51/0072* (2013.01); *H01L 51/5206* (2013.01); *H01L 51/5234* (2013.01); *H01L 51/5262* (2013.01); *H05B 33/10* (2013.01); *C09K 2211/1007* (2013.01); *C09K 2211/1011* (2013.01); *C09K 2211/1014* (2013.01); *C09K 2211/1029* (2013.01); *H01L 51/5281* (2013.01); *Y02E 10/549* (2013.01)

(56) References Cited

FOREIGN PATENT DOCUMENTS

| | | |
|---|---|---|
| KR | 10-2010-0021907 A | 2/2010 |
| KR | 10-2010-0021908 A | 2/2010 |
| KR | 10-2010-0021909 A | 2/2010 |
| KR | 10-2011-0110591 A | 10/2011 |
| WO | WO2006070912 A1 | 7/2006 |
| WO | WO2006109493 A1 | 10/2006 |
| WO | WO2008062636 A1 | 5/2008 |

\* cited by examiner

ORGANIC ELECTRONIC ELEMENT INCLUDING LIGHT EFFICIENCY IMPROVING LAYER, ELECTRONIC DEVICE INCLUDING THE SAME, AND COMPOUND FOR THE SAME

CROSS-REFERENCE TO RELATED APPLICATION

This patent application claims benefit under 35 U.S.C. 119(a), and is a National Stage entry from International Application No. PCT/KR2013/001585, filed on Feb. 27, 2013, which claims priority to Korean Patent Application No. 10-2012-0025433, filed on Mar. 13, 2012, the contents of which are hereby incorporated by reference for all purposes as if fully set forth herein.

TECHNICAL FIELD

The present invention relates to an organic electronic element including a light efficiency improving layer, an electronic device including the same, and a compound for the same.

BACKGROUND ART

Generally, an organic light emitting phenomenon refers to a phenomenon in which electric energy is converted into light energy by an organic material. An organic electronic element utilizing the organic light emitting phenomenon is usually configured to have a structure including an anode, a cathode, and an organic layer interposed therebetween. As such, in order to increase the efficiency and stability of an organic electronic element, the organic layer may be mostly provided in the form of a multilayer structure including layers made of different materials, for example, a hole injection layer, a hole transport layer, a light emitting layer, an electron transport layer, and an electron injection layer.

Materials useful for the organic layer in an organic electronic element may be classified into, depending on the function thereof, light emitting materials and charge transport materials, for example, a hole injection material, a hole transport material, an electron transport material, an electron injection material, etc. Further, the light emitting materials may be classified into high-molecular-weight materials and low-molecular-weight materials depending on the molecular weight thereof, and may also be classified into, depending on the emission mechanism thereof, fluorescent materials derived from the singlet excited state of electrons and phosphorescent materials derived from the triplet excited state of electrons. Furthermore, the light emitting materials may be classified into, depending on the emission color thereof, blue, green, and red light emitting materials, and yellow and orange light emitting materials necessary for better natural color reproduction.

In particular, thorough research is ongoing into organic materials which are inserted into a hole transport layer or a buffer layer to achieve excellent lifetime characteristics of an organic electronic element. To this end, a hole injection layer material is required, which has high hole mobility to an organic layer from an anode and exhibits high uniformity and low crystallinity upon forming a thin film after deposition.

Moreover, there is required to develop a hole injection layer material that retards penetration and diffusion of metal oxide into an organic layer from an anode (indium tin oxide (ITO)), which may be regarded as a reason for reduction in the lifetime of an organic electronic element, and also that has stability against Joule heat generated during the operation of an organic electronic element, namely, a high glass transition temperature. Also, it is reported that the low glass transition temperature of a hole transport layer material has a significant influence on the lifetime of an organic electronic element because the uniformity of the surface of a thin film is broken during the operation of the element. Furthermore, a deposition process is mainly applied to form an organic light emitting diode (OLED), and thus there is a need for a material that may endure such a deposition process, namely, a highly heat-resistant material.

Meanwhile, when only a single material is used as a light emitting material, there occur problems of shift of a maximum emission wavelength to a longer wavelength due to intermolecular interactions and lowering of the efficiency of the element due to deterioration in color purity or reduction in luminous efficiency. Hence, a host/dopant system may be adopted as the light emitting material in order to enhance the color purity and to increase the luminous efficiency through energy transfer. This is based on the principle that if a small amount of dopant having a smaller energy band gap than a host for a light emitting layer is mixed in the light emitting layer, then excitons generated from the light emitting layer are transported to the dopant, thus emitting light with high efficiency. With regard to this, as the wavelength of the host is shifted to the wavelength band of the dopant, light having a desired wavelength may be obtained depending on the type of dopant.

In order to allow an organic electronic element to sufficiently exhibit superior properties as above, it is prerequisite to support a material constituting an organic layer in the element, for example, a hole injection material, a hole transport material, a light emitting material, an electron transport material, an electron injection material, or the like, with a stable and efficient material. However, such stable and efficient organic layer materials for an organic electronic element have not yet been fully developed. Accordingly, there is a continuous need to develop new organic layer materials.

Recently, enhancements in the characteristics of elements by changing performance of individual materials are under study, and also improvements in color purity and efficiency due to the optimal optical thickness between an anode and a cathode in a top element having a resonant structure are regarded as important in terms of enhancing the performance of the element. Compared to a bottom element having a non-resonant structure, the top element is configured such that the produced light is reflected from the anode as a reflective film and is emitted from the cathode, remarkably increasing optical energy loss due to SPPs (Surface Plasmon Polaritons).

Thus, with the goal of improving the shape and efficiency of EL spectrum, formation of a capping layer on the top cathode is employed. Typically, as for SPP, electron emission is mainly carried out using four metals Al, Pt, Ag and Au, and surface plasmon is generated from the surface of the metal electrode. For example, when Ag is used for the cathode, emitted light is quenched by SPP due to the cathode Ag (light energy loss due to Ag), undesirably decreasing light efficiency.

Whereas, when the capping layer is used, SPPs are generated at the boundary between the MgAg electrode and the high-refractive-index organic material, of which TE (Transverse Electric) polarized light disappears on the CPL plane in a vertical direction by an evanescent wave, and TM (Transverse Magnetic) polarized light, which travels along the cathode and the capping layer, causes amplification of the wavelength by surface plasma resonance, thereby increasing the intensity of the peak, consequently making it possible to increase light efficiency and to effectively adjust the color purity.

Accordingly, an aspect of the present invention is intended to provide an organic electronic element including a light efficiency improving layer, which may exhibit high luminous efficiency, low driving voltage, improved color purity and long lifetime of the element, an electronic device including the same, and a compound for the same.

Specifically, in order to solve the problems encountered in the prior art and to accomplish the above aspect for high luminous efficiency, low driving voltage, improved color purity, high stability and long lifetime of the element, an aspect of the present invention is to provide an organic electronic element including a light efficiency improving layer using a compound represented by Chemical Formula 1 below:

Chemical Formula 1

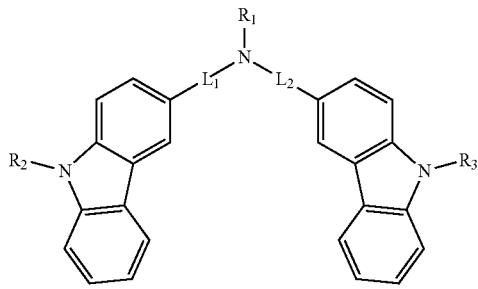

wherein (1) $R_1$, $R_2$ and $R_3$ are each independently selected from the group consisting of a $C_6$ to $C_{60}$ aryl group unsubstituted or substituted with one or more substituents selected from the group consisting of hydrogen, deuterium, halogen, a $C_1$ to $C_{20}$ alkyl group, a $C_1$ to $C_{20}$ alkoxy group, a $C_1$ to $C_{20}$ alkylamine group, a $C_1$ to $C_{20}$ alkylthiophene group, a $C_6$ to $C_{20}$ arylthiophene group, a $C_2$ to $C_{20}$ alkenyl group, a $C_2$ to $C_{20}$ alkynyl group, a $C_3$ to $C_{20}$ cycloalkyl group, a $C_6$ to $C_{60}$ aryl group, a deuterium-substituted $C_6$ to $C_{20}$ aryl group, a $C_8$ to $C_{20}$ arylalkenyl group, a silane group, a boron group, a germanium group, and a $C_2$ to $C_{20}$ heterocyclic group;

a $C_2$ to $C_{60}$ heterocyclic group unsubstituted or substituted with one or more substituents selected from the group consisting of hydrogen, deuterium, halogen, a $C_1$ to $C_{20}$ alkyl group, a $C_2$ to $C_{20}$ alkenyl group, a $C_1$ to $C_{20}$ alkoxy group, a $C_6$ to $C_{20}$ arylamine group, a $C_6$ to $C_{60}$ aryl group, a deuterium-substituted $C_6$ to $C_{20}$ aryl group, a $C_7$ to $C_{20}$ arylalkyl group, a $C_8$ to $C_{20}$ arylalkenyl group, a $C_2$ to $C_{20}$ heterocyclic group, a nitrile group and an acetylene group, and containing at least one of O, N, S, Si and P as a hetero atom; and a $C_1$ to $C_{50}$ alkyl group unsubstituted or substituted with a substituent selected from the group consisting of a $C_1$ to $C_{20}$ alkyl group, a $C_2$ to $C_{20}$ alkenyl group, a $C_1$ to $C_{20}$ alkoxy group, a $C_6$ to $C_{60}$ aryl group, a $C_7$ to $C_{20}$ arylalkyl group, a $C_8$ to $C_{20}$ arylalkenyl group, a $C_2$ to $C_{20}$ heterocyclic group, a nitrile group and an acetylene group, and (2) $L_1$ and $L_2$ are independently selected from the group consisting of a direct bond; a $C_6$ to $C_{60}$ arylene group unsubstituted or substituted with one or more substituents selected from the group consisting of nitro, nitrile, halogen, a $C_1$ to $C_{20}$ alkyl group, a $C_1$ to $C_{20}$ alkoxy group and an amino group; and a $C_2$ to $C_{60}$ heterocyclic group unsubstituted or substituted with one or more substituents selected from the group consisting of deuterium, halogen, a silane group, a cyano group, a nitro group, a $C_1$ to $C_{20}$ alkoxy group, a $C_1$ to $C_{20}$ alkyl group, a $C_2$ to $C_{20}$ alkenyl group, a $C_6$ to $C_{20}$ aryl group, a deuterium-substituted a $C_6$ to $C_{20}$ aryl group, a $C_3$ to $C_{20}$ cycloalkyl group, a $C_7$ to $C_{20}$ arylalkyl group and a $C_8$ to $C_{20}$ arylalkenyl group, and containing at least one of O, N, S, Si and P as a hetero atom.

More specifically, the compound represented by Chemical Formula 1 may be any one selected from the group consisting of Chemical Formulas 2 to 4 below.

Chemical Formula 2

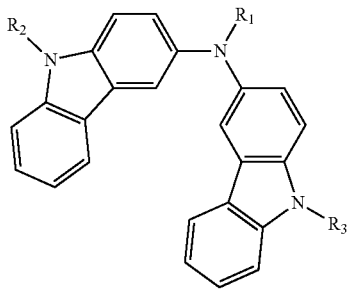

Chemical Formula 3

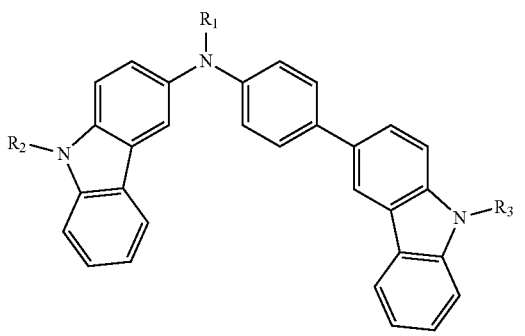

Chemical Formula 4

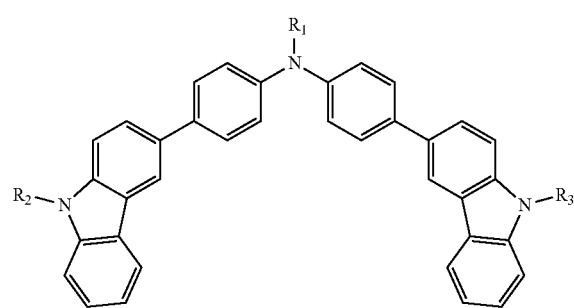

In addition, aspects of the present invention are to provide an electronic device including the organic electronic element using the compound as above, and a compound for the organic electronic element, which is represented by the above chemical formula and plays a role in improving light efficiency.

Illustratively, the organic electronic element according to an embodiment of the present invention includes a first electrode; a second electrode; one or more organic layers formed between the first electrode and the second electrode; and a light efficiency improving layer formed on at least one of an upper side and a lower side of the first electrode and the second electrode, opposite to the side on which the organic layers are formed, wherein the light efficiency improving layer includes the compound represented by Chemical Formula 1. Further, the compound of Chemical Formula 1 may be used for an organic layer. As such, the organic layer may be at least one of a light emitting layer, a hole injection layer, a hole transport layer, an electron injection layer, and an electron transport layer.

The light efficiency improving layer may be formed on at least one of the lower side of the first electrode and the upper side of the second electrode. Illustratively, the first electrode may be an anode formed of ITO including Ag, the second electrode may be a cathode including Mg—Ag, and the light efficiency improving layer may be formed on the upper side of the second electrode. Also, the second electrode may be a light transmissive cathode, and the light efficiency improving layer may be formed on the upper side of the second electrode.

Illustratively, the first electrode may be a light transmissive anode, and the light efficiency improving layer may be formed on the lower side of the first electrode.

Illustratively, when the organic layers are patterned for R, G and B pixels, the light efficiency improving layer may be formed in common to the R, G and B pixels. Further, the light efficiency improving layer may include at least one of a light efficiency improving layer-R formed on a region corresponding to the R pixel, a light efficiency improving layer-G formed on a region corresponding to the G pixel, and a light efficiency improving layer-B formed on a region corresponding to the B pixel, for R, G and B pixels of the organic layers.

Another embodiment of the present invention provides an electronic device including a display device, which includes the above described organic electronic element having the compound of Chemical Formula 1, and a control unit for controlling the display device. The organic electronic element according to an embodiment of the present invention may be any one selected from the group consisting of an OLED, an organic solar cell, an organic photoconductor (OPC), and an organic transistor (organic TFT).

As a light efficiency improving layer including a compound according to an embodiment of the present invention is provided, light efficiency of an organic electronic element according to an embodiment of the present invention can be remarkably improved, thus exhibiting high luminous efficiency, low driving voltage and greatly improved color purity and lifetime of the element.

DETAILED DESCRIPTION

Figure 1:
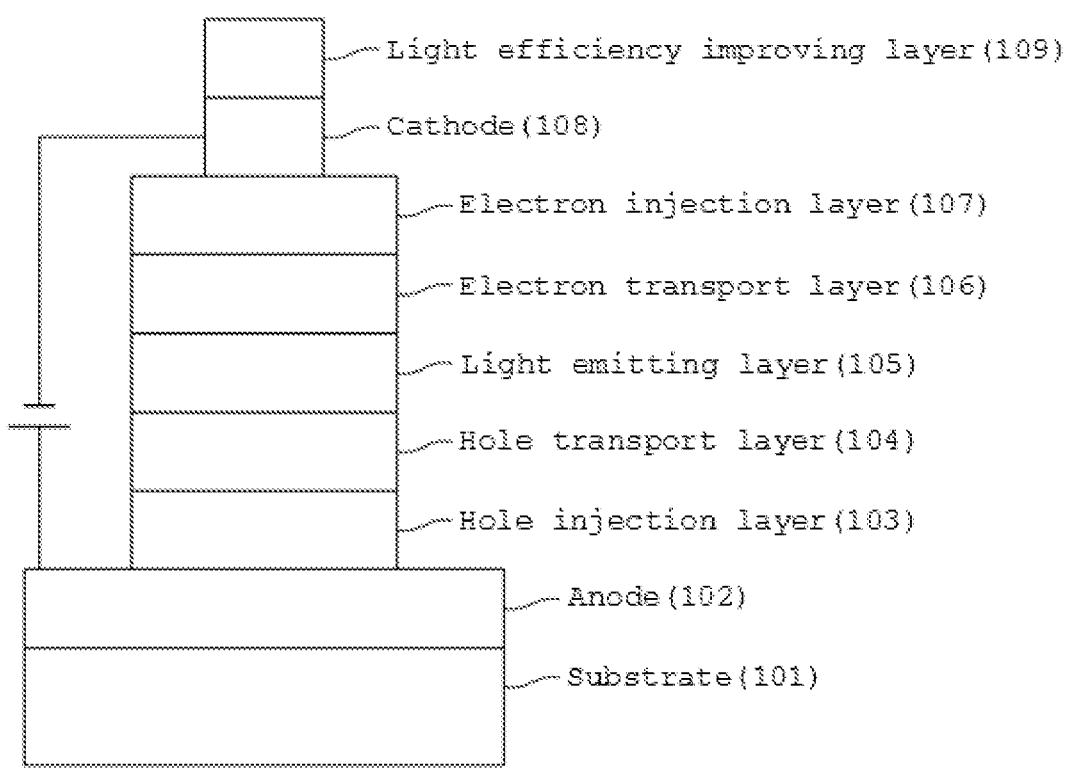
FIGS. 1 and 2 schematically illustrate OLEDs according to embodiments of the present invention.

Hereinafter, a detailed description will be given of some embodiments of the present invention through illustrative drawings.

In designation of reference numerals to components in respective drawings, it should be noted that the same elements will be designated by the same reference numerals although they are shown in different drawings. Further, in the following description of the present invention, a detailed description of known functions and configurations incorporated herein will be omitted when it may make the subject matter of the present invention unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). It should be noted that if it is described in the specification that one component is "connected," "coupled" or "joined" to another component, a third component may be "connected," "coupled," and "joined" between the first and second components, although the first component may be directly connected, coupled or joined to the second component.

A better understanding of the present invention may be obtained via synthesis examples and test examples of compounds which may be applied to a light efficiency improving layer according to embodiments of the present invention. However, the following preparation examples and test examples are set forth to illustrate, but are not to be construed as limiting the scope of the present invention. Further, compounds which are not illustrated but may be incorporated in the present invention may be prepared through the following preparation examples by persons having ordinary knowledge in the art, namely, those skilled in the art.

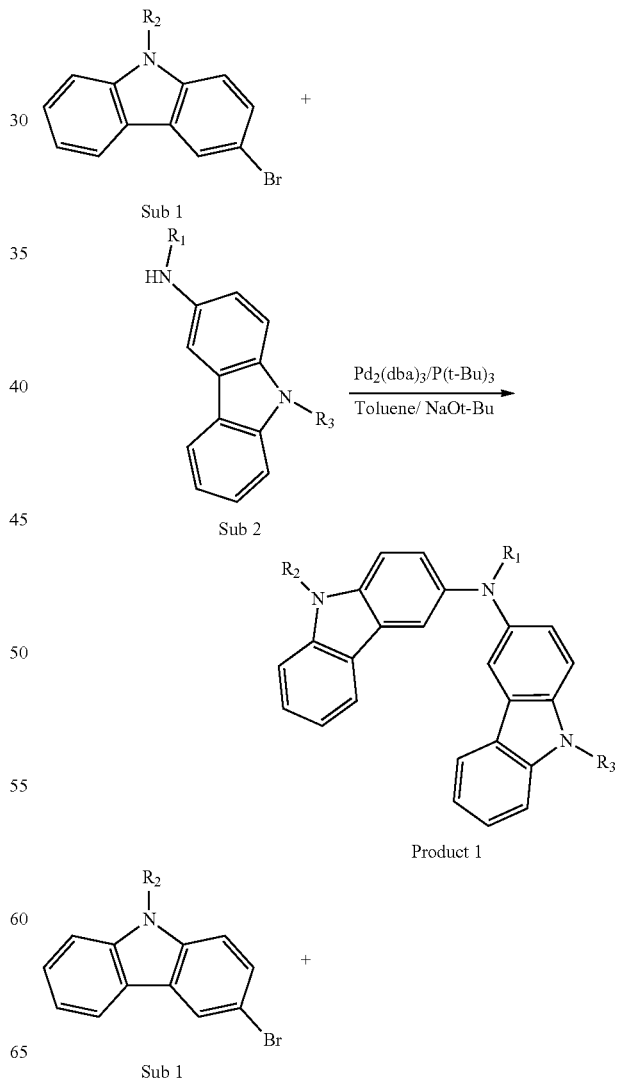

-continued

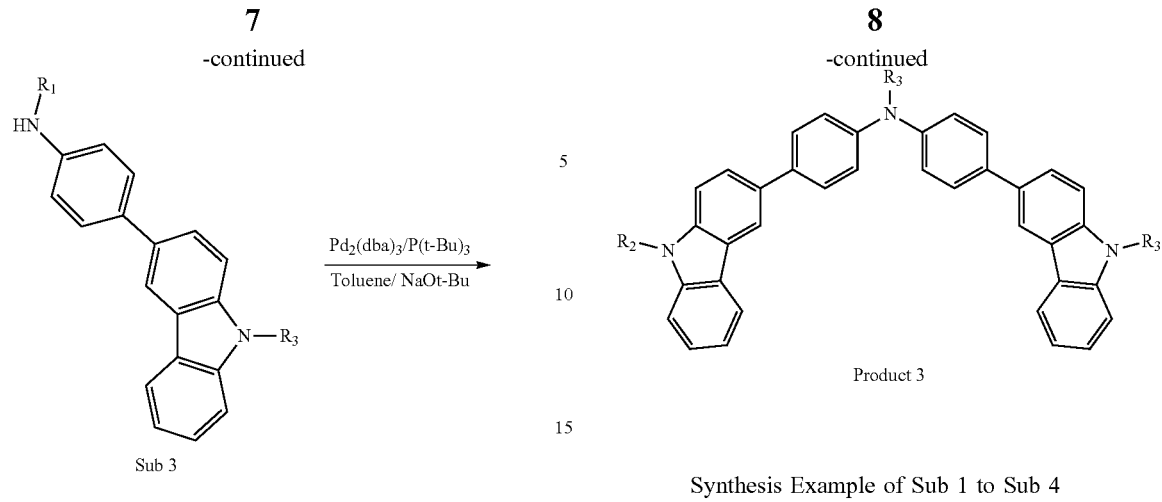

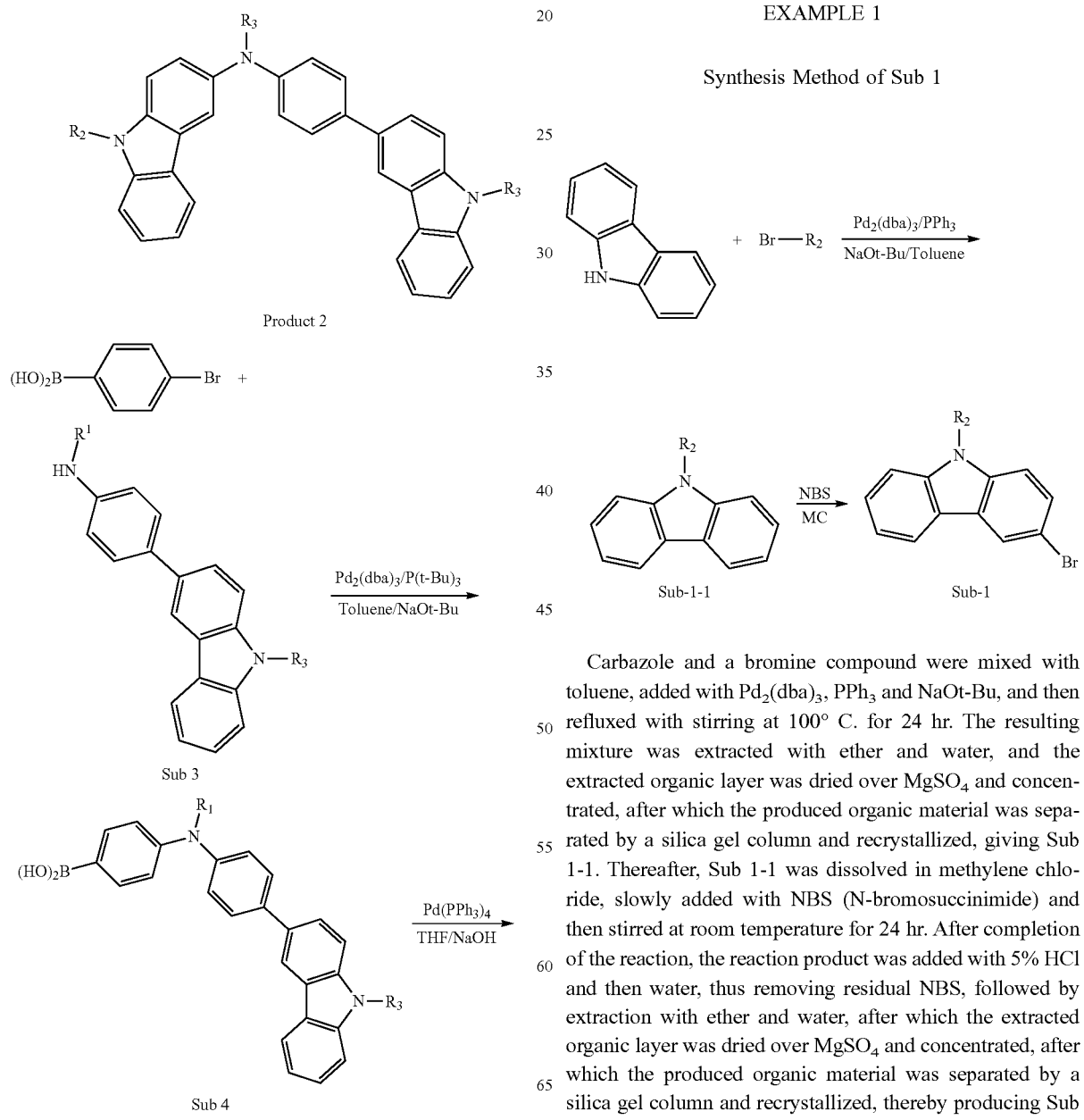

Synthesis Example of Sub 1 to Sub 4

EXAMPLE 1

Synthesis Method of Sub 1

Carbazole and a bromine compound were mixed with toluene, added with Pd₂(dba)₃, PPh₃ and NaOt-Bu, and then refluxed with stirring at 100° C. for 24 hr. The resulting mixture was extracted with ether and water, and the extracted organic layer was dried over MgSO₄ and concentrated, after which the produced organic material was separated by a silica gel column and recrystallized, giving Sub 1-1. Thereafter, Sub 1-1 was dissolved in methylene chloride, slowly added with NBS (N-bromosuccinimide) and then stirred at room temperature for 24 hr. After completion of the reaction, the reaction product was added with 5% HCl and then water, thus removing residual NBS, followed by extraction with ether and water, after which the extracted organic layer was dried over MgSO₄ and concentrated, after which the produced organic material was separated by a silica gel column and recrystallized, thereby producing Sub 1.

EXAMPLE 2

Synthesis Method of Sub 2

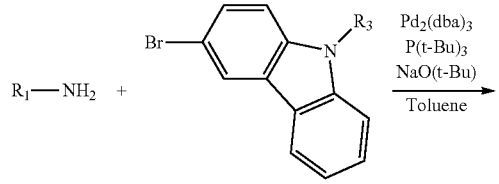

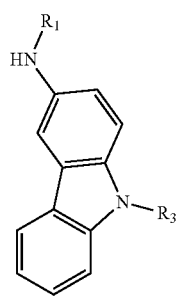

Sub 2

In a round-bottom flask, an amine compound (1 eqiv.), a bromine compound (1.1 equiv.), $Pd_2(dba)_3$ (0.05 mol %), $P(t-Bu)_3$ (0.1 equiv.), NaOt-Bu (3 equiv.) and toluene (10.5 mL/1 mmol) were placed and allowed to react at 100° C. After completion of the reaction, the reaction product was extracted with ether and water, and the extracted organic layer was dried over $MgSO_4$ and concentrated, after which the produced organic material was separated by a silica gel column and recrystallized, thereby producing Sub 2.

EXAMPLE 3

Synthesis Method of Sub 3

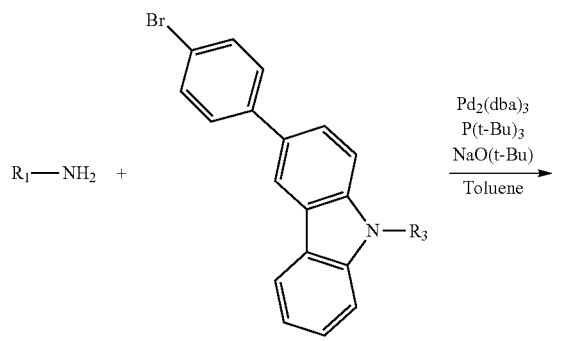

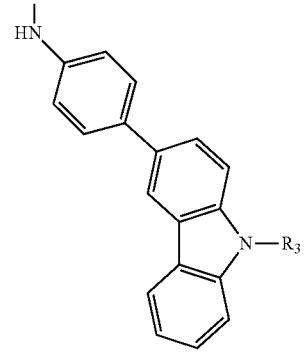

Sub 3

In a round-bottom flask, an amine compound (1 eqiv.), a bromine compound (1.1 equiv.), $Pd_2(dba)_3$ (0.05 mol %), $P(t-Bu)_3$ (0.1 equiv.), NaOt-Bu (3 equiv.) and toluene (10.5 mL/1 mmol) were placed and allowed to react at 100° C. After completion of the reaction, the reaction product was extracted with ether and water, and the extracted organic layer was dried over $MgSO_4$ and concentrated, after which the produced organic material was separated by a silica gel column and recrystallized, thereby producing Sub 3.

EXAMPLE 4

Synthesis Method of Sub 4

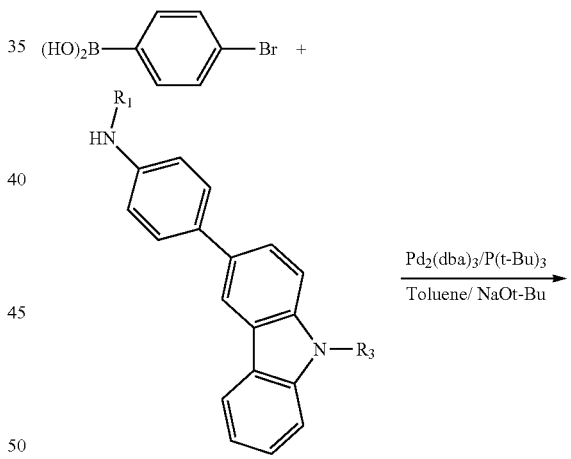

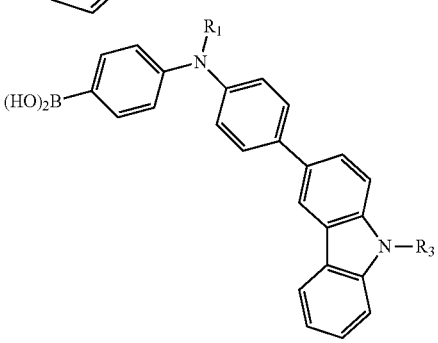

Sub 4

In a round-bottom flask, 4-bromophenylboronic acid (1 eqiv.), the amine compound of Sub 3 (1.1 equiv.), $Pd_2(dba)_3$ (0.03~0.0 mol %), P(t-Bu)₃ (0.1 equiv.), NaOt-Bu (3 equiv.) and toluene (10.5 mL/1 mmol) were placed and allowed to react at 100° C. After completion of the reaction, the reaction product was extracted with ether and water, and the extracted organic layer was dried over MgSO₄ and concentrated, after which the produced organic material was separated by a silica gel column and recrystallized, thereby producing Sub 4.

Examples of Sub 4 may include, but are not limited to, the following.

Sub 4-1

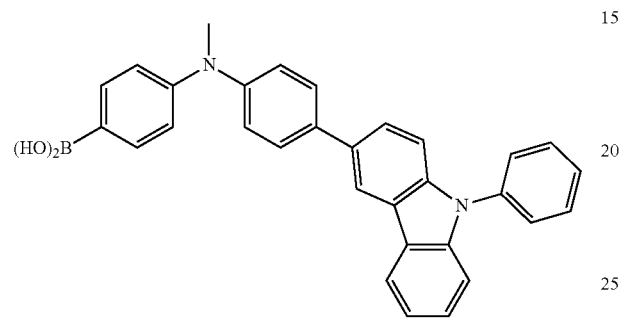

Sub 4-2

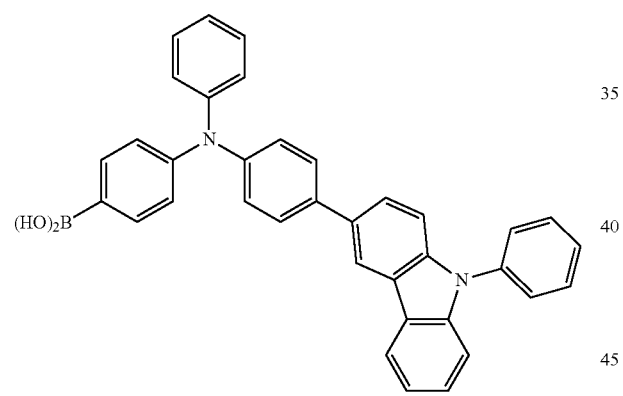

Sub 4-3

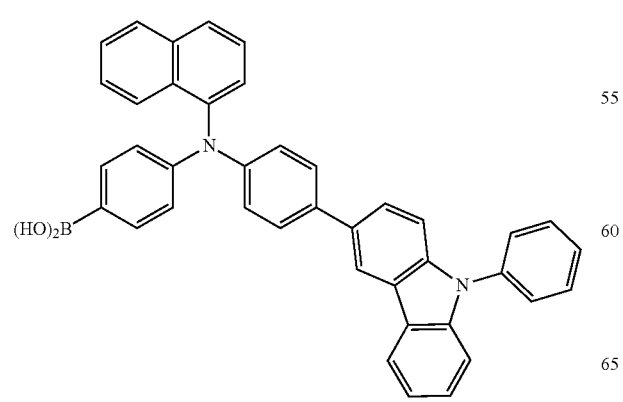

Sub 4-4

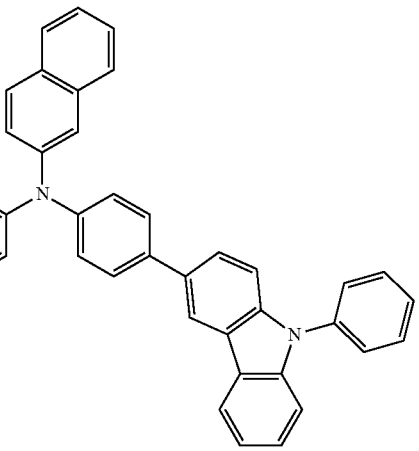

Sub 4-5

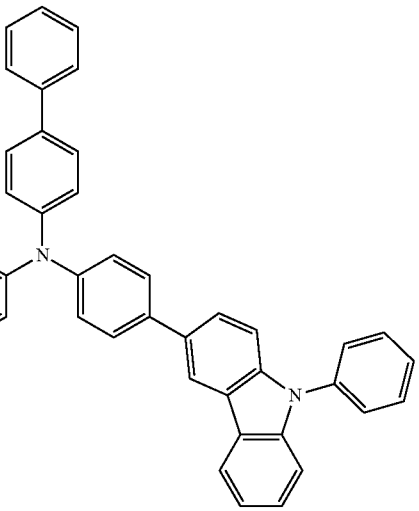

Sub 4-6

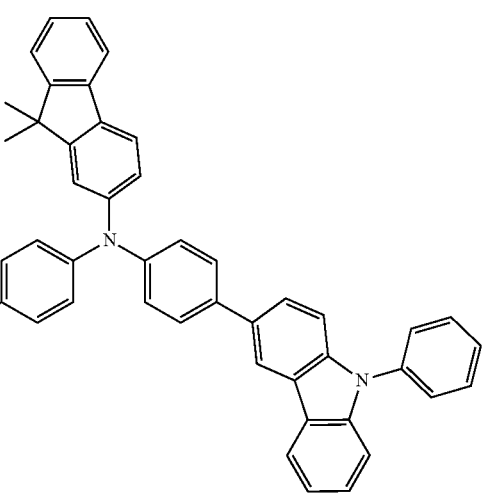

Sub 4-7

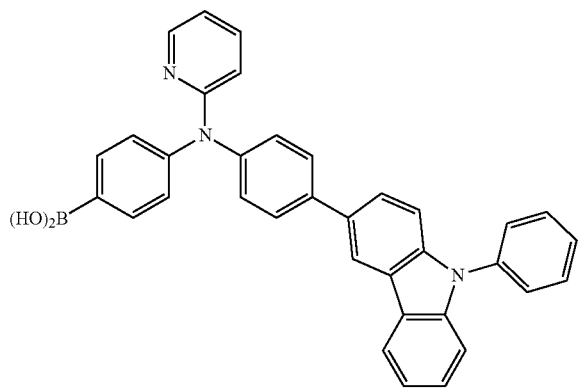

Sub 4-8

The results of mass analysis of Sub 4 are shown in Table 1 below.

TABLE 1

| Compound | FD-MS | Compound | FD-MS |
|---|---|---|---|
| Sub 4-1 | m/z = 454.19 ($C_{30}H_{23}BN_2O_2$ = 454.33) | Sub 4-2 | m/z = 530.22 ($C_{36}H_{27}BN_2O_2$ = 530.42) |
| Sub 4-3 | m/z = 580.23 ($C_{40}H_{29}BN_2O_2$ = 580.48) | Sub 4-4 | m/z = 580.23 ($C_{40}H_{29}BN_2O_2$ = 580.48) |
| Sub 4-5 | m/z = 606.25 ($C_{42}H_{31}BN_2O_2$ = 606.52) | Sub 4-6 | m/z = 646.28 ($C_{45}H_{35}BN_2O_2$ = 646.58) |
| Sub 4-7 | m/z = 531.21 ($C_{35}H_{26}BN_3O_2$ = 531.41) | Sub 4-8 | m/z = 510.25 ($C_{34}H_{31}BN_2O_2$ = 510.43) |

Synthesis Example of Product

EXAMPLE 5

Synthesis method of Product 1

In a round-bottom flask, Sub 1 (1 eqiv.), Sub 2 (1.1 equiv.), Pd$_2$(dba)$_3$ (0.05 mol %), P(t-Bu)$_3$ (0.1 equiv.), NaOt-Bu (3 equiv.) and toluene (10.5 mL/1 mmol) were placed and allowed to react at 100° C. After completion of the reaction, the reaction product was extracted with ether and water, and the extracted organic layer was dried over MgSO$_4$ and concentrated, after which the produced organic material was separated by a silica gel column and recrystallized, giving a final product.

Synthesis of Product 1-5

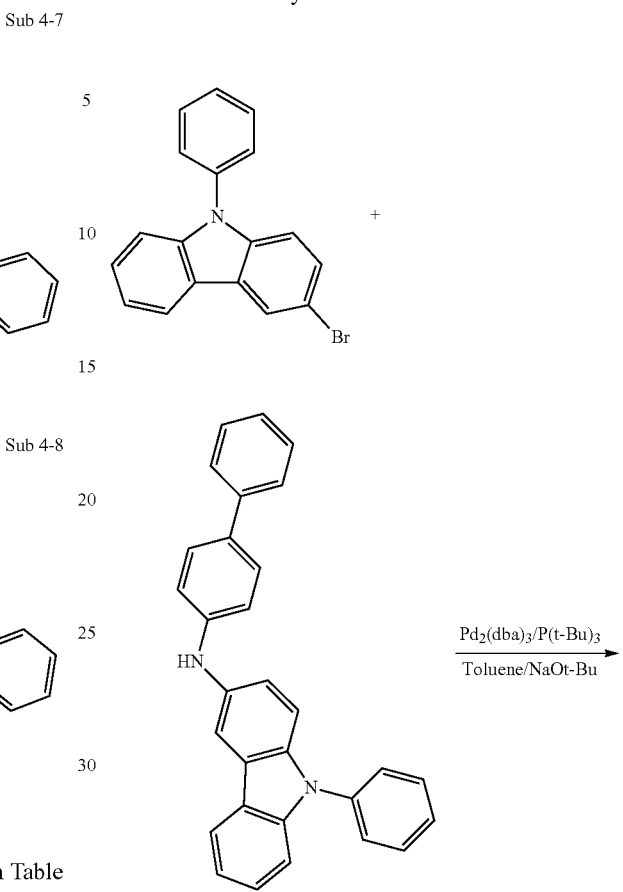

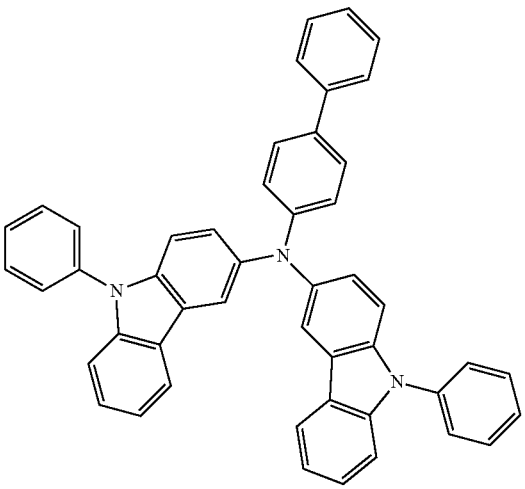

In a round-bottom flask, 3-bromo-9-phenyl-9H-carbazole (6.4 g, 20 mmol), N-(biphenyl-4-yl)-9-phenyl-9H-carbazol-3-amine (9.9 g, 24 mmol), Pd$_2$(dba)$_3$ (0.03~0.05 mmol), P(t-Bu)$_3$ (0.1 equiv.), NaOt-Bu (3 equiv.) and toluene (10.5 mL/1 mmol) were placed and allowed to react at 100° C. After completion of the reaction, the reaction product was extracted with ether and water, and the extracted organic layer was dried over MgSO$_4$ and concentrated, after which the produced organic material was separated by a silica gel column and recrystallized, giving 8.5 g of a final product (yield: 65%).

EXAMPLE 6

Synthesis Method of Product 2

In a round-bottom flask, Sub 1 (1 eqiv.), Sub 3 (1.1 equiv.), Pd$_2$(dba)$_3$ (0.05 mol %), P(t-Bu)$_3$ (0.1 equiv.), NaOt-Bu (3 equiv.) and toluene (10.5 mL/1 mmol) were placed and allowed to react at 100° C. After completion of the reaction, the reaction product was extracted with ether and water, and the extracted organic layer was dried over MgSO$_4$ and concentrated, after which the produced organic material was separated by a silica gel column and recrystallized, giving a final product.

Synthesis of Product 2-11

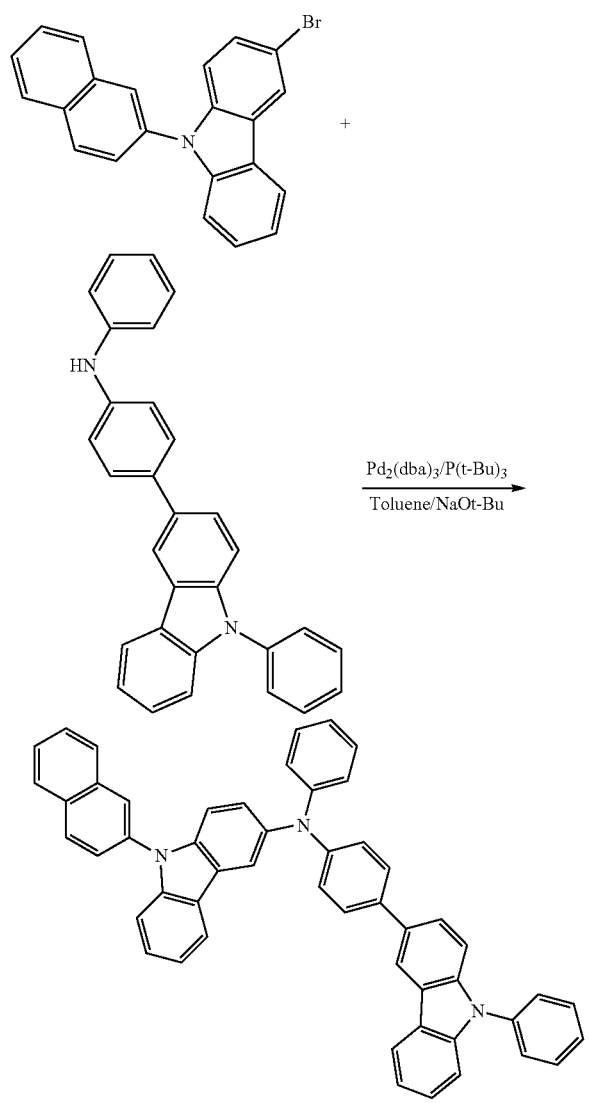

In a round-bottom flask, 3-bromo-9-(naphthalen-2-yl)-9H-carbazole (7.4 g, 20 mmol), N-phenyl-4-(9-phenyl-9H-carbazol-3-yl)aniline (9.9 g, 24 mmol), Pd$_2$(dba)$_3$ (0.03~0.05 mmol), P(t-Bu)$_3$ (0.1 equiv.), NaOt-Bu (3 equiv.) and toluene (10.5 mL/1 mmol) were placed and allowed to react at 100° C. After completion of the reaction, the reaction product was extracted with ether and water, and the extracted organic layer was dried over MgSO$_4$ and concentrated, after which the produced organic material was separated by a silica gel column and recrystallized, giving 8.8 g of a final product (yield: 63%).

EXAMPLE 7

Synthesis Method of Product 3

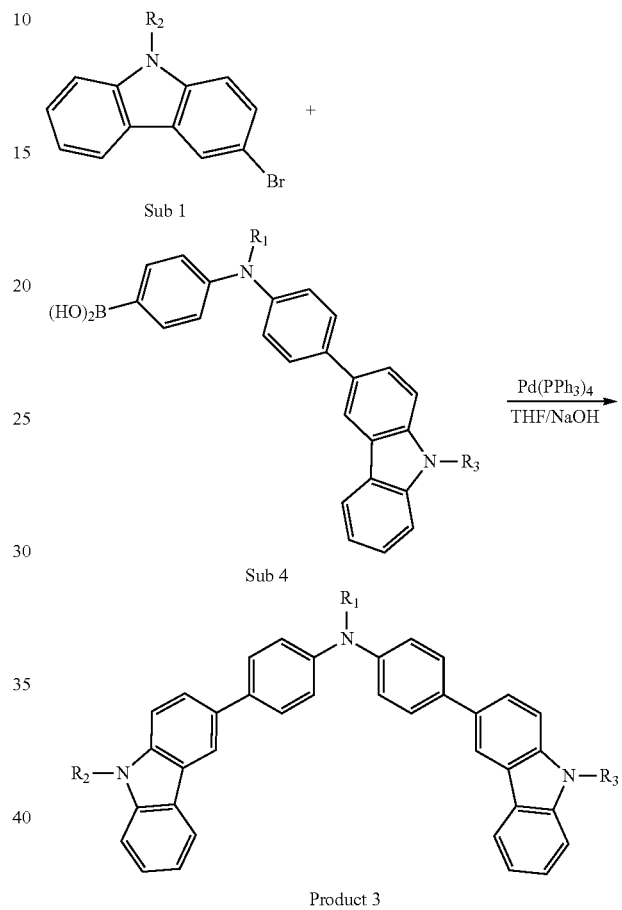

In a round-bottom flask, Sub 1 (1 eqiv.), Sub 4 (1.1 equiv.), Pd(PPh$_3$)$_4$ (0.05 mol %), NaOH (3 equiv.), THF (3 mL/1 mmol) and water (1.5 mL/1 mmol) were placed and heated to reflux at 80~90° C. After completion of the reaction, the reaction product was diluted with distilled water at room temperature and then extracted with methylene chloride and water, and the extracted organic layer was dried over MgSO$_4$ and concentrated, after which the produced compound was separated by a silica gel column and recrystallized, giving a final product.

Synthesis of Product 3-2

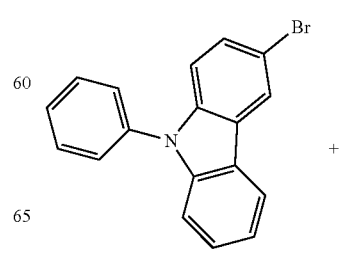

-continued

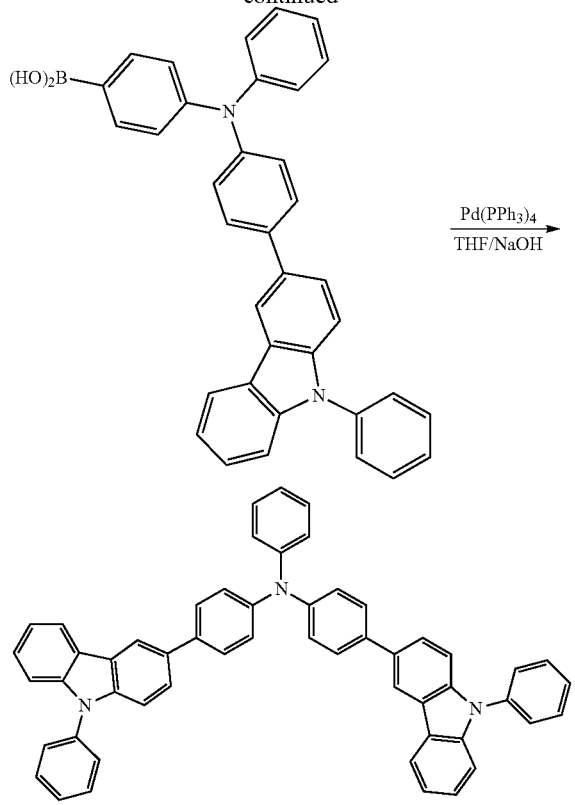

In a round-bottom flask, 3-bromo-9-phenyl-9H-carbazole (6.4 g, 20 mmol), 4-(phenyl(4-(9-phenyl-9H-carbazol-3-yl)phenyl)amino)phenylboronic acid (12.7 g, 24 mmol), Pd(PPh$_3$)$_4$ (0.03~0.05 equiv.), NaOH (3 equiv.), THF (3 mL/1 mmol) and water (1.5 mL/1 mmol) were placed and heated to reflux at 80~90° C. After completion of the reaction, the reaction product was diluted with distilled water at room temperature and then extracted with methylene chloride and water, and the extracted organic layer was dried over MgSO$_4$ and concentrated, after which the produced compound was separated by a silica gel column and recrystallized, giving 9.3 g of a product (yield: 66%).

The following specific compounds 1-1 to 3-16 may be prepared by the methods as above, and the results of mass analysis of these compounds are shown in Table 2 below.

The compounds represented by Chemical Formula 1 according to an embodiment to the present invention may include, but are not limited to, the following specific compounds. Because individual substituents of the compounds represented by Chemical Formula 1 are extensively wide, it is actually impossible to exemplify all compounds and thus representative compounds are illustratively described, but other compounds represented by Chemical Formula 1 which are not disclosed herein may be incorporated in the present invention.

1-1

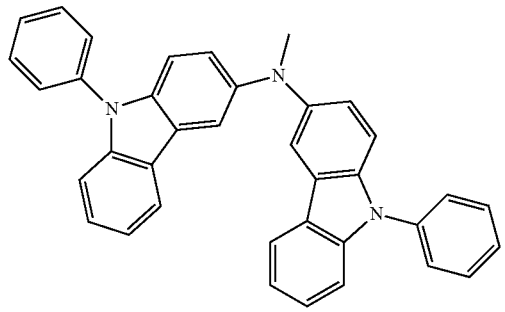

1-2

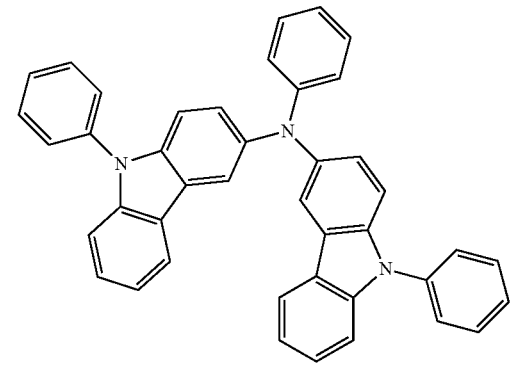

1-3

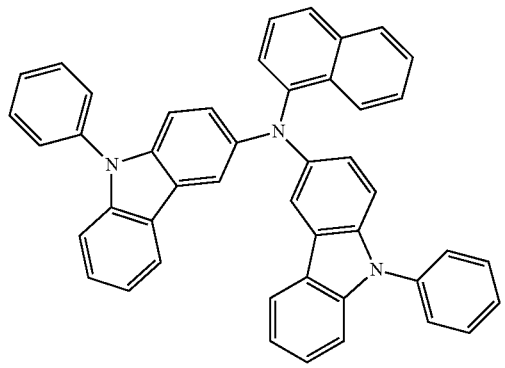

1-4

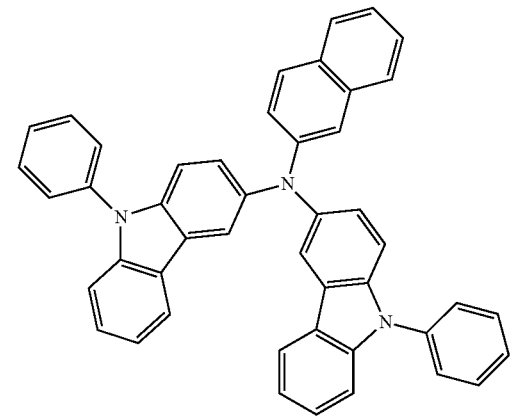

-continued
1-5
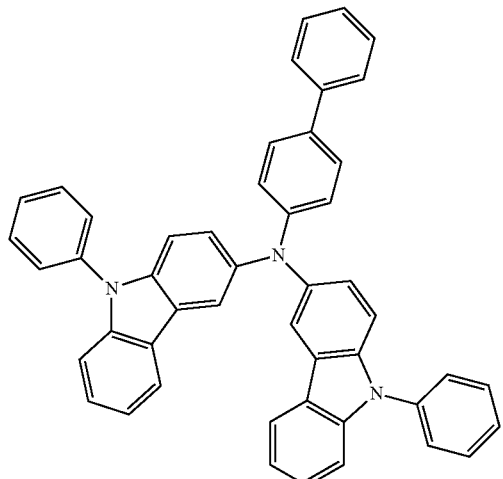
1-6
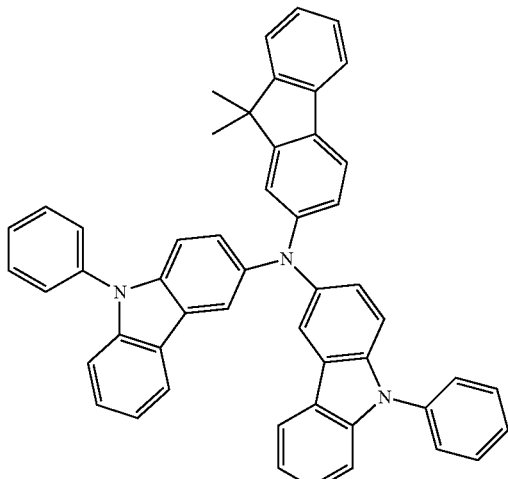
1-7
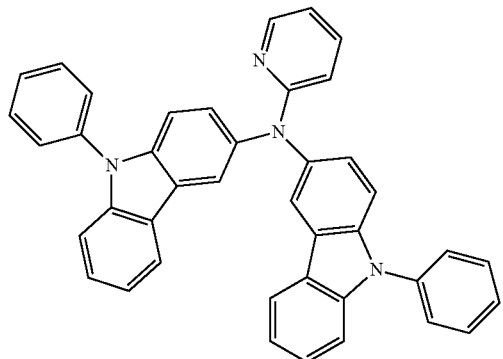
1-8
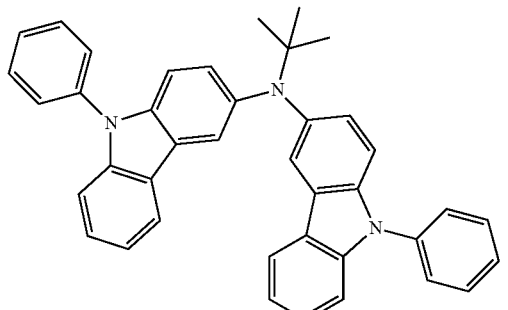
1-9
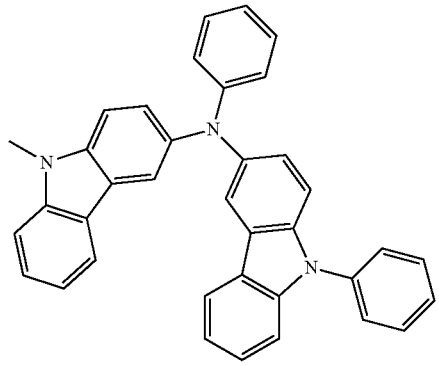
1-10
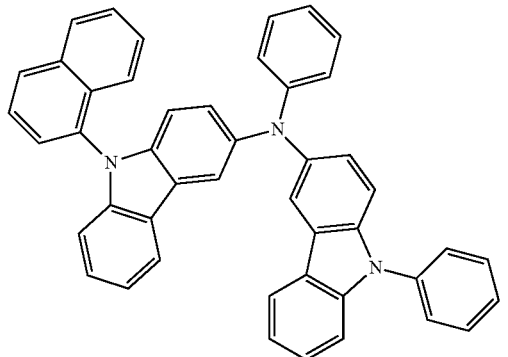
1-11
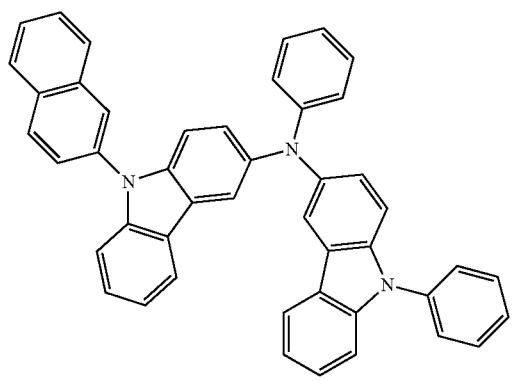
1-12
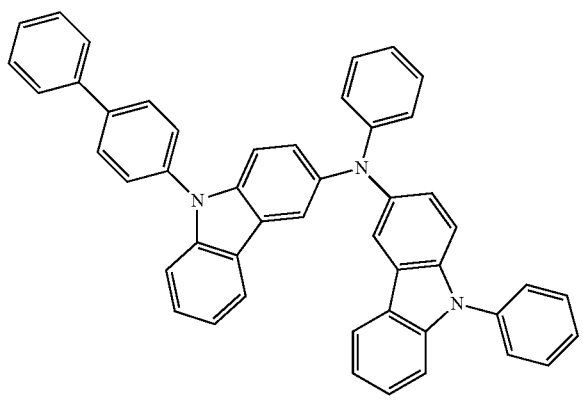

-continued
1-13
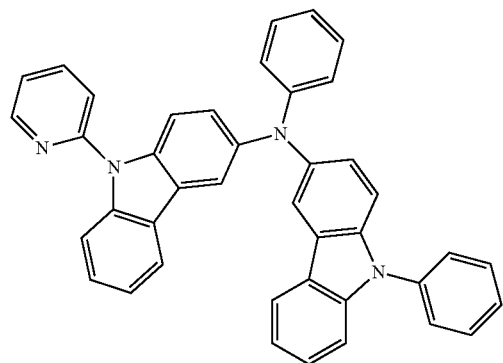
1-14
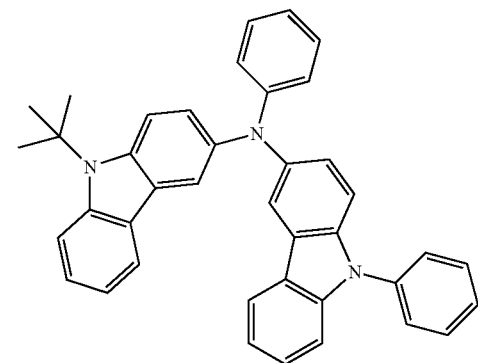
1-15
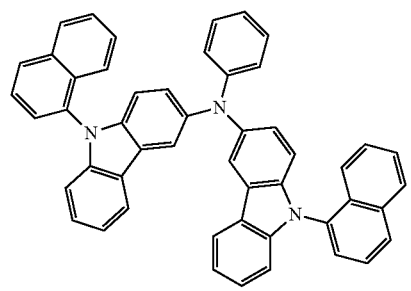
1-16
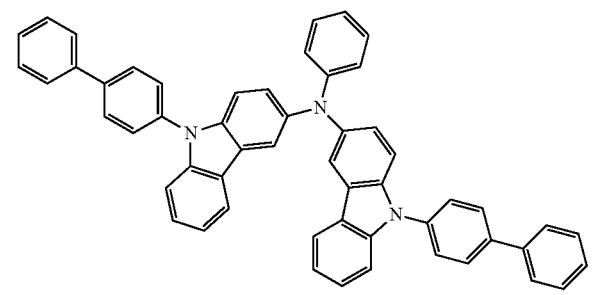
2-1
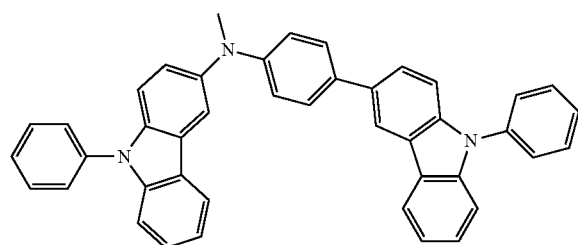
2-2
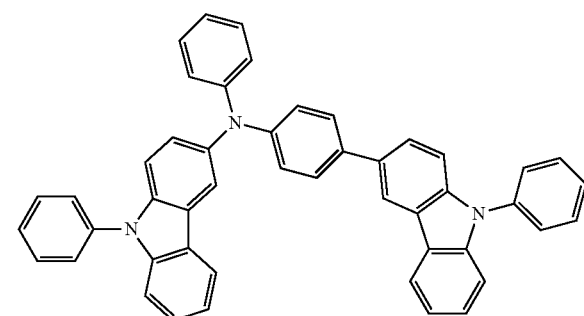
2-3
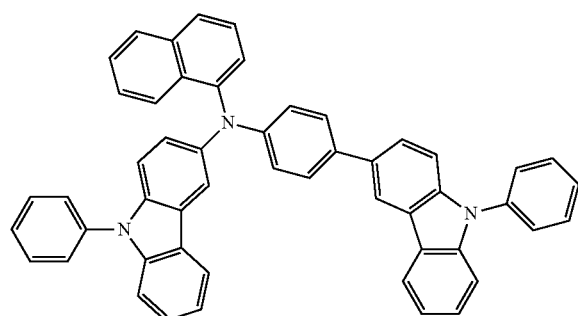
2-4
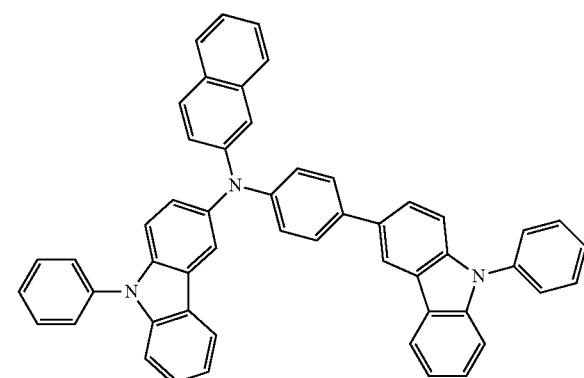

-continued
2-5
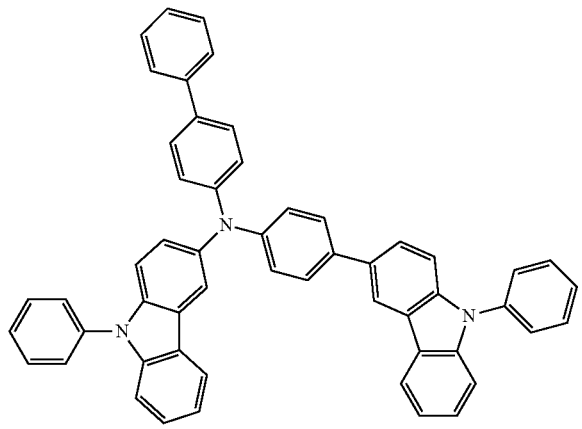
2-6
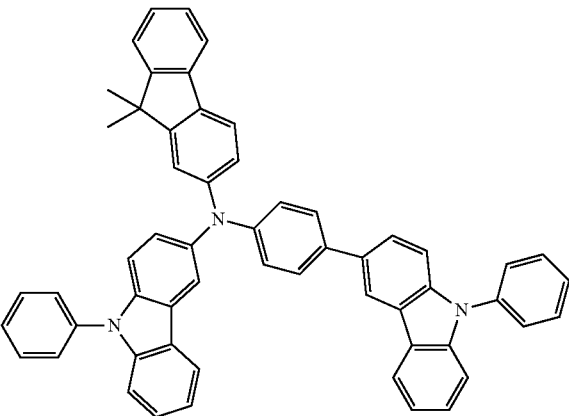
2-7
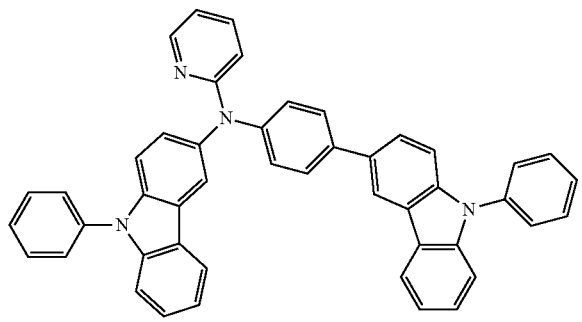
2-8
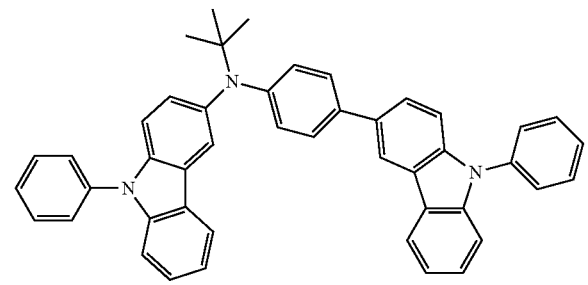
2-9
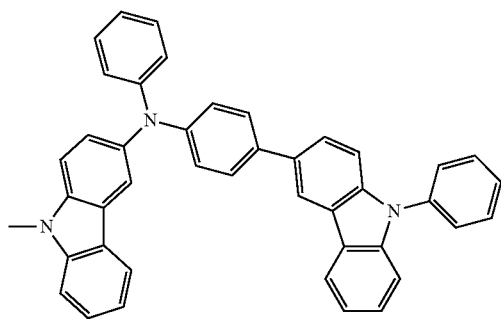
2-10
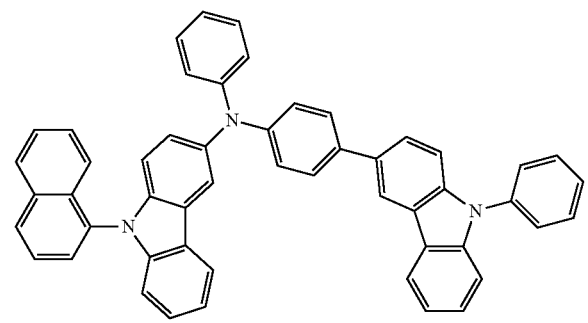
2-11
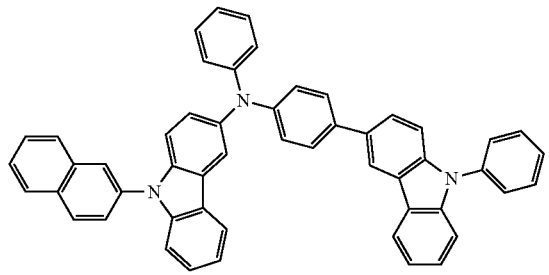
2-12
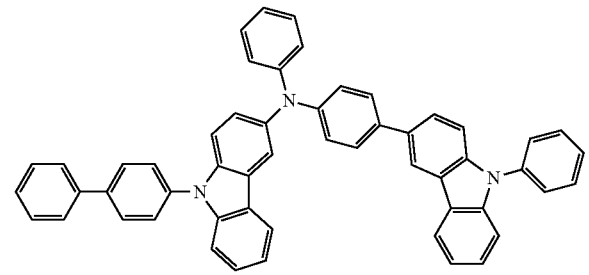

2-13 2-14
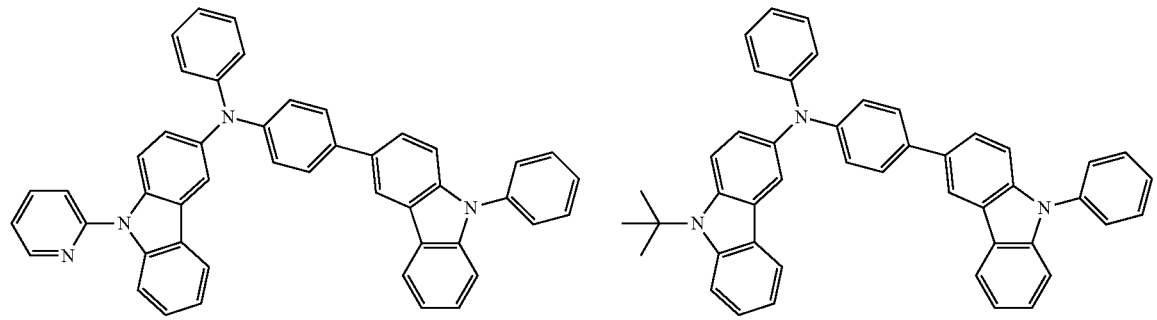
2-15 2-16
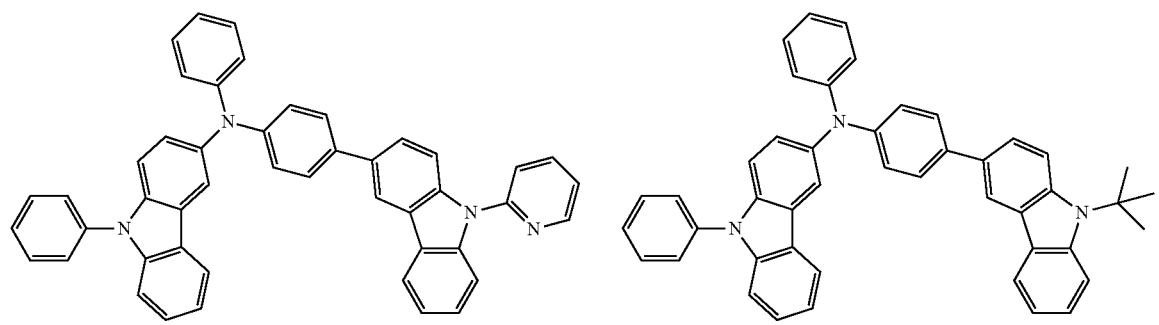
3-1 3-2
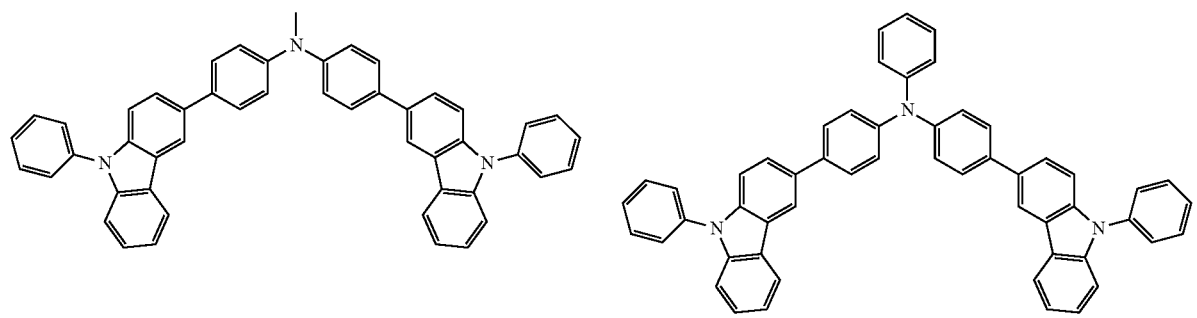
3-3 3-4
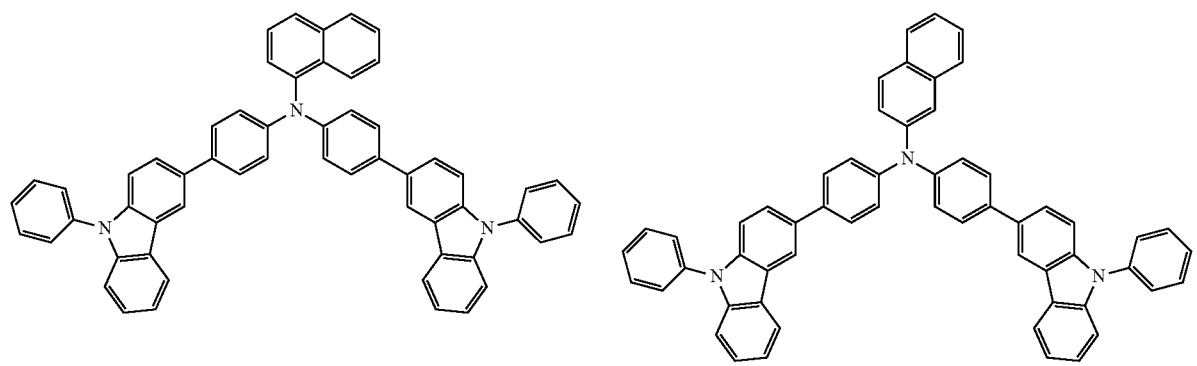

-continued
3-5
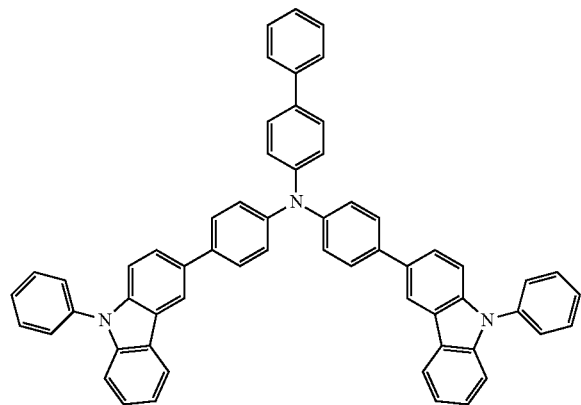
3-6
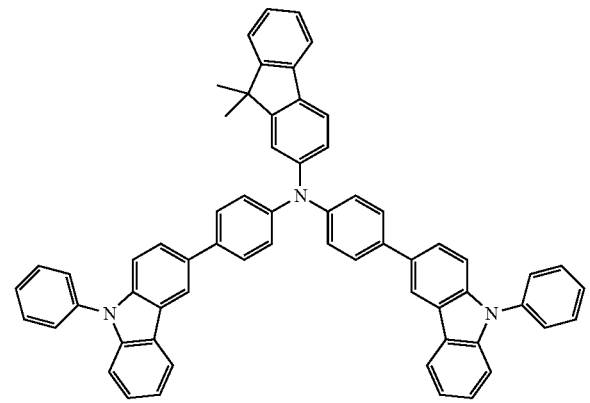
3-7
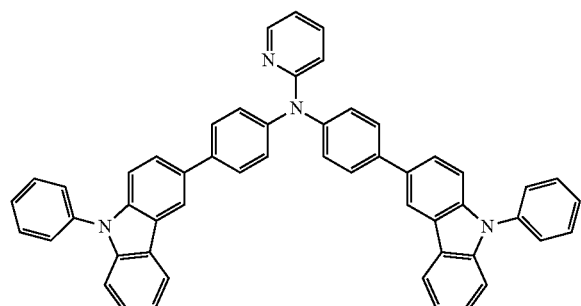
3-8
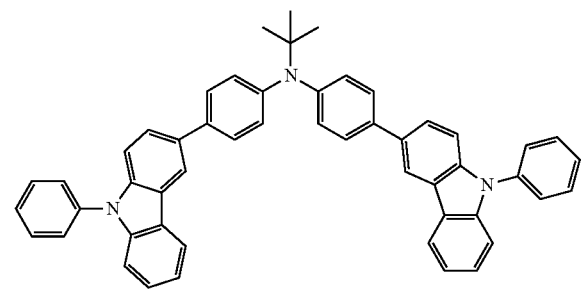
3-9
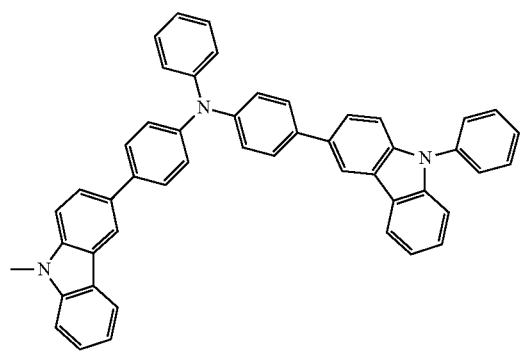
3-10
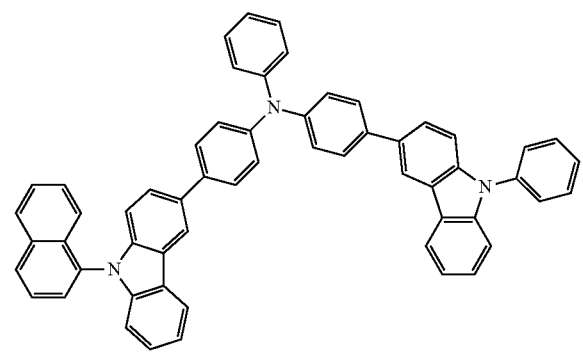
3-11
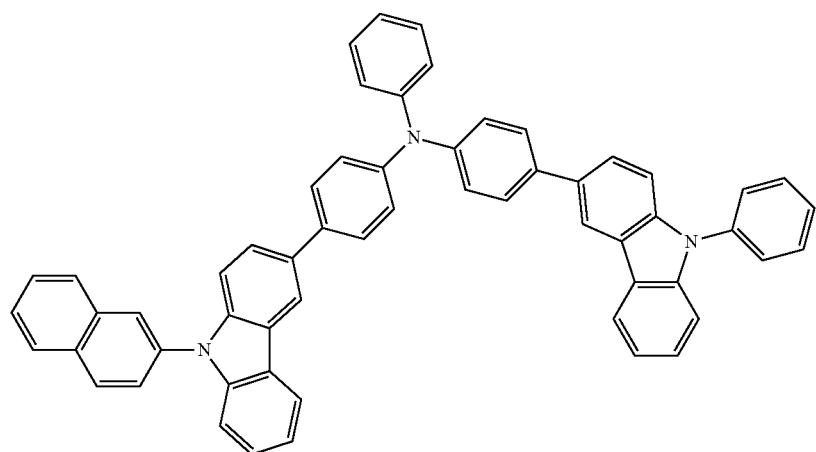

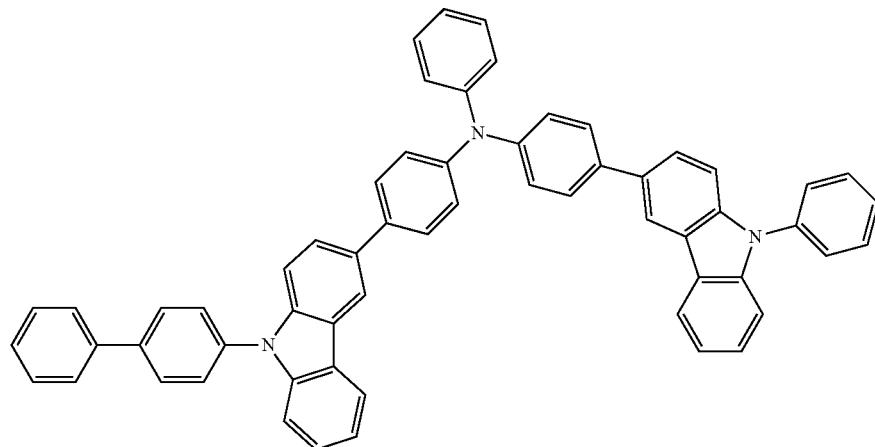

3-12

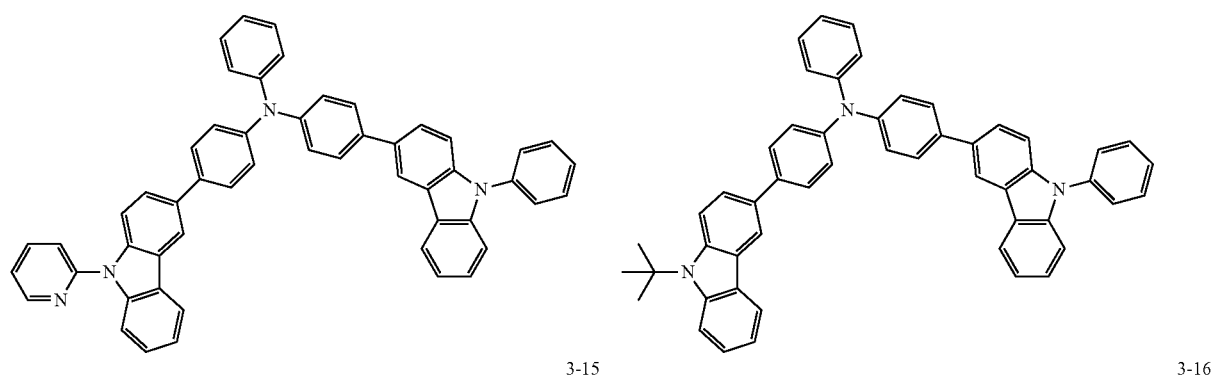

3-13 3-14

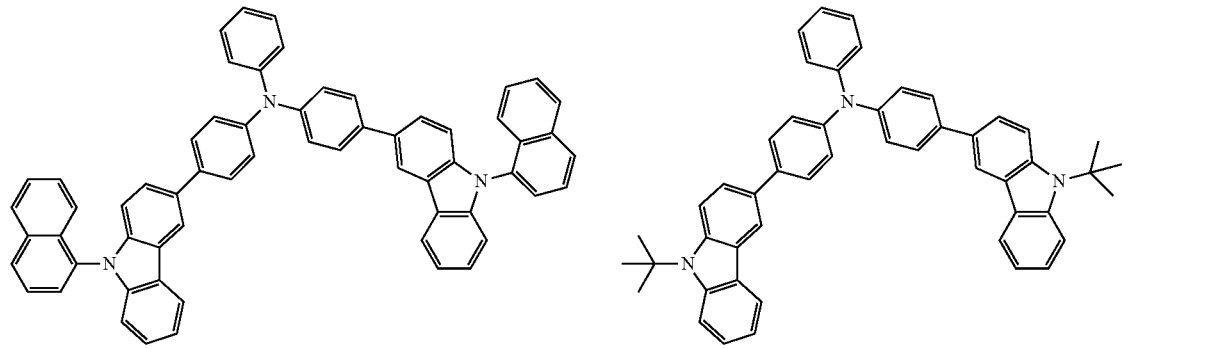

3-15 3-16

TABLE 2

| Compound | FD-MS | Compound | FD-MS |
|---|---|---|---|
| 1-1 | m/z = 513.22 ($C_{37}H_{27}N_3$ = 513.63) | 1-2 | m/z = 575.24 ($C_{42}H_{29}N_3$ = 575.70) |
| 1-3 | m/z = 625.25 ($C_{46}H_{31}N_3$ = 625.76) | 1-4 | m/z = 625.25 ($C_{46}H_{31}N_3$ = 625.76) |
| 1-5 | m/z = 651.27 ($C_{48}H_{33}N_3$ = 651.80) | 1-6 | m/z = 691.30 ($C_{51}H_{37}N_3$ = 691.86) |
| 1-7 | m/z = 576.23 ($C_{41}H_{28}N_4$ = 576.69) | 1-8 | m/z = 555.27 ($C_{40}H_{33}N_3$ = 555.71) |
| 1-9 | m/z = 513.22 ($C_{37}H_{27}N_3$ = 513.63) | 1-10 | m/z = 625.25 ($C_{46}H_{31}N_3$ = 625.76) |
| 1-11 | m/z = 625.25 ($C_{46}H_{31}N_3$ = 625.76) | 1-12 | m/z = 651.27 ($C_{48}H_{33}N_3$ = 651.80) |
| 1-13 | m/z = 576.23 ($C_{41}H_{28}N_4$ = 576.69) | 1-14 | m/z = 555.27 ($C_{40}H_{33}N_3$ = 555.71) |
| 1-15 | m/z = 675.27 ($C_{50}H_{33}N_3$ = 675..82) | 1-16 | m/z = 727.30 ($C_{54}H_{37}N_3$ = 727.89) |
| 2-1 | m/z = 589.25 ($C_{43}H_{31}N_3$ = 589.73) | 2-2 | m/z = 651.27 ($C_{48}H_{33}N_3$ = 651.80) |
| 2-3 | m/z = 701.28 ($C_{52}H_{35}N_3$ = 701.85) | 2-4 | m/z = 701.28 ($C_{52}H_{35}N_3$ = 701.85) |
| 2-5 | m/z = 727.30 ($C_{54}H_{37}N_3$ = 727.89) | 2-6 | m/z = 767.33 ($C_{57}H_{41}N_3$ = 767.96) |
| 2-7 | m/z = 652.26 ($C_{47}H_{32}N_4$ = 652.78) | 2-8 | m/z = 631.30 ($C_{46}H_{37}N_3$ = 631.81) |
| 2-9 | m/z = 589.25 ($C_{43}H_{31}N_3$ = 589.73) | 2-10 | m/z = 701.28 ($C_{52}H_{35}N_3$ = 701.85) |
| 2-11 | m/z = 701.28 ($C_{52}H_{35}N_3$ = 701.85) | 2-12 | m/z = 727.30 ($C_{54}H_{37}N_3$ = 727.89) |

TABLE 2-continued

| Compound | FD-MS | Compound | FD-MS |
|---|---|---|---|
| 2-13 | m/z = 652.26 ($C_{47}H_{32}N_4$ = 652.78) | 2-14 | m/z = 631.30 ($C_{46}H_{37}N_3$ = 631.81) |
| 2-15 | m/z = 652.26 ($C_{47}H_{32}N_4$ = 652.78) | 2-16 | m/z = 631.30 ($C_{46}H_{37}N_3$ = 631.81) |
| 3-1 | m/z = 665.28 ($C_{49}H_{35}N_3$ = 651.80) | 3-2 | m/z = 727.30 ($C_{54}H_{37}N_3$ = 727.89) |
| 3-3 | m/z = 777.31 ($C_{58}H_{39}N_3$ = 777.95) | 3-4 | m/z = 777.31 ($C_{58}H_{39}N_3$ = 777.95) |
| 3-5 | m/z = 803.33 ($C_{60}H_{41}N_3$ = 803.99) | 3-6 | m/z = 843.36 ($C_{63}H_{45}N_3$ = 844.05) |
| 3-7 | m/z = 728.29 ($C_{52}H_{36}N_4$ = 728.88) | 3-8 | m/z = 707.33 ($C_{52}H_{41}N_3$ = 707.90) |
| 3-9 | m/z = 665.28 ($C_{49}H_{35}N_3$ = 651.80) | 3-10 | m/z = 777.31 ($C_{58}H_{39}N_3$ = 777.95) |
| 3-11 | m/z = 777.31 ($C_{58}H_{39}N_3$ = 777.95) | 3-12 | m/z = 803.33 ($C_{50}H_{41}N_3$ = 803.99) |
| 3-13 | m/z = 728.29 ($C_{53}H_{36}N_4$ = 728.88) | 3-14 | m/z = 707.33 ($C_{52}H_{41}N_3$ = 707.90) |
| 3-15 | m/z = 827.33 ($C_{62}H_{41}N_3$ = 828.01) | 3-16 | m/z = 687.36 ($C_{50}H_{45}N_3$ = 687.91) |

As mentioned above, individual substituents of the compounds represented by Chemical Formula 1 are very wide and thus synthesis examples of representative compounds are illustratively described but other compounds represented by Chemical Formula 1 which are not disclosed in synthesis examples may also be incorporated in the present invention.

When the core structure as above is introduced with a variety of substituents, compounds having inherent properties of the introduced substituents may be synthesized. For example, upon fabrication of organic electronic elements including OLEDs, substituents for use in a hole injection layer material, a hole transport layer material, a light emitting layer material and an electron transport layer material are introduced to the aforementioned structure, and thereby materials which may satisfy the requirements of individual organic layers may be prepared. Particularly, the compound according to an embodiment of the present invention may be used alone in a light efficiency improving layer (hereinafter which may be referred to as a "capping layer" (CPL)).

The compound according to an embodiment of the present invention may be variously utilized in OLEDs depending on the kinds and properties of substituents.

Because the compound according to an embodiment of the present invention may be freely adjusted by the core and the substituents, it may be applied to a host for a phosphorescent or fluorescent light emitting layer and a variety of layers, in addition to the capping layer.

The organic electronic element according to an embodiment of the present invention may be manufactured by typical materials and methods for manufacturing an organic electronic element, with the exception that the capping layer and one or more organic layers are formed using the compounds as above.

Even when the compounds according to embodiments of the present invention are applied to other organic layers of the OLED, in addition to the capping layer, for example, a light emitting layer, an emission auxiliary layer, an electron injection layer, an electron transport layer and a hole injection layer, the same effects are expected to result.

Meanwhile, the compound according to an embodiment of the present invention may undergo a soluble process. Specifically, this compound may be formed into a capping layer or organic layers of an organic electronic element using a soluble process. When this compound is used in the capping layer or/and the organic layers, a smaller number of organic layers may be formed using various polymer materials not by a deposition process but by a soluble process or a solvent process, for example, spin coating, dip coating, doctor blading, screen printing, inkjet printing or heat transfer.

Examples of the organic electronic element using the compounds according to embodiments of the present invention may include OLEDs, organic solar cells, OPC drums, and organic TFTs.

The organic electronic element using the compound according to an embodiment of the present invention is exemplified by an OLED, but the present invention is not limited thereto, and this compound may be utilized in various organic electronic elements.

An embodiment of the present invention addresses an organic electronic element, especially an OLED, including a first electrode, a second electrode, an organic layer between the first and the second electrode, and a capping layer, wherein the capping layer includes the compound represented by Chemical Formula 1 according to the present invention.

Another embodiment of the present invention addresses an OLED, wherein the capping layer and the organic layer include the compound according to an embodiment of the present invention.

Figure 2:
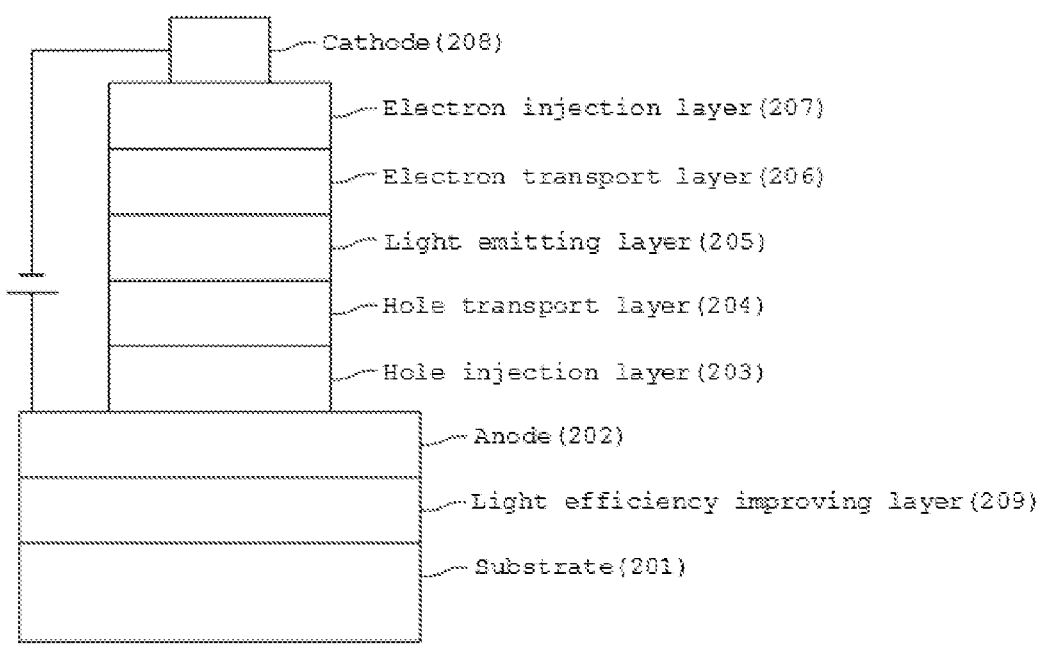

The structures of the OLEDs according to embodiments of the present invention are illustrated in FIGS. 1 and 2, but are not limited thereto.

With reference to FIGS. 1 and 2, the OLED according to an embodiment of the present invention includes a substrate 101, 201, a first electrode (anode) 102, 202, an organic layer, a second electrode (cathode) 108, 208, and a capping layer 109, 209, wherein the capping layer 109, 209 may be formed on the lower side of the first electrode (bottom emission mode) or/and the upper side of the second electrode (top emission mode).

As for a top emission mode, light formed by the light emitting layer is emitted toward the cathode. While the light emitted toward the cathode passes through the capping layer (CPL) formed of an organic material having a relatively high refractive index, the wavelength of light is amplified and thus light efficiency may increase.

As for a bottom emission mode, the capping layer according to the present invention is provided, thus increasing light efficiency of the organic electronic element, by the same principle.

The capping layer may not be formed in only the position described above. Although the formation of the capping layer on the upper side of the second electrode and the lower side of the first electrode in FIGS. 1 and 2, respectively, is depicted, the capping layer may be formed on the lower side of the first electrode, as well as the upper side of the second electrode in FIG. 1.

In FIGS. 1 and 2, the organic layers may include a hole injection layer 103, a hole transport layer 104, a light emitting layer 105, an electron transport layer 106, and an electron injection layer 107, at least one of which may be omitted.

Although not shown, the OLED may further include a hole block layer (HBL) for blocking movement of holes, an electron block layer (EBL) for blocking movement of electrons, an emission auxiliary layer for aiding or supporting light emission, and a passivation layer. As for the passivation layer, it may be formed as an uppermost layer to protect the organic layer or the cathode.

Also, the compound according to an embodiment of the present invention may be contained in not only the capping layer but also one or more of the organic layers including a hole injection layer, a hole transport layer, a light emitting layer and an electron transport layer.

The OLED according to another embodiment of the present invention may be manufactured by depositing a metal, a conductive metal oxide or an alloy thereof on a substrate using PVD (Physical Vapor Deposition) such as sputtering or e-beam evaporation to form an anode; forming, on the anode, organic layers including a hole injection layer, a hole transport layer, a light emitting layer, an electron transport layer and an electron injection layer; and then depositing a cathode material. As such, the capping layer according to the present invention may be formed on the lower side of the anode or the upper side of the cathode.

In addition to the method as above, an organic electronic element may be manufactured by sequentially depositing a cathode material, an organic layer material and an anode material on a substrate. The organic layer may have a multilayer structure including a hole injection layer, a hole transport layer, a light emitting layer, an electron transport layer and an electron injection layer, but is not limited thereto and may be provided in the form of a monolayer structure.

Also, smaller numbers of organic layers and capping layers may be formed using various polymer materials not by a deposition process but by a soluble process or a solvent process, for example, spin coating, dip coating, doctor blading, screen printing, inkjet printing or heat transfer.

In the OLED according to another embodiment of the present invention, the compound as above may undergo a soluble process such as spin coating or an ink jet process.

The substrate is a support of the OLED, and may include a silicon wafer, a quartz or glass plate, a metal plate, or a plastic film or sheet.

The anode is positioned on the substrate. This anode functions to inject holes to the hole injection layer positioned thereon. The anode material may be a material having a high work function so that holes may be efficiently injected to the organic layer. Specific examples of the anode material usable in the present invention include, but are not limited to, metals or alloys thereof, such as vanadium, chromium, copper, zinc, and gold; metal oxides such as zinc oxide, indium oxide, indium tin oxide (ITO) and indium zinc oxide (IZO); combinations of metal and oxide such as ZnO:Al and SnO$_2$:Sb; and conductive polymers such as poly(3-methylthiophene), poly[3,4-(ethylene-1,2-dioxy)thiophene] (PEDT), polypyrrole and polyaniline. The anode of the present invention may be exemplified by ITO including Ag (Ag is provided in the form of a thin film).

The hole injection layer is positioned on the anode. The material for the hole injection layer has high hole injection efficiency from the anode and enables efficient transport of the injected holes. To this end, low ionization potential, high transparency with respect to visible light, and high hole stability are required.

The hole injection material may be a material that allows holes to be efficiently injected from the anode at low voltage, and HOMO (Highest Occupied Molecular Orbital) of the hole injection material may be set between the work function of the anode material and the HOMO of the peripheral organic layer. Specific examples of the hole injection material may include organic materials such as metal porphyrine, oligothiophene and arylamine, organic materials such as hexanitrile hexaazatriphenylene and quinacridone, organic materials such as perylene, and conductive polymers such as anthraquinone, polyaniline and polythiophene, but are not limited thereto.

The hole transport layer is positioned on the hole injection layer. The hole transport layer receives holes from the hole injection layer so that the holes are transported to the organic light emitting layer positioned thereon, and may exhibit high hole mobility and hole stability and may block electrons. In addition to the general requirements as above, when the element is applied to vehicle displays, heat resistance is required. Hence, useful is a material having a glass transition temperature ($T_g$) of 70° C. or more.

Examples of the material satisfying such requirements may include NPD (or NPB), spiro-arylamine-based compounds, perylene-arylamine-based compounds, azacycloheptatriene compounds, bis(diphenylvinylphenyl)anthracene, silicon germanium oxide compounds, and silicon-based arylamine compounds.

The organic light emitting layer is positioned on the hole transport layer. The organic light emitting layer is a layer for emitting light by recombining holes and electrons injected from the anode and the cathode, respectively, and it is made of a material having high quantum efficiency. The light emitting material plays a role in combining holes and electrons received from the hole transport layer and the electron transport layer, respectively, thus emitting visible light. Also useful is a material having high fluorescent or phosphorescent quantum efficiency.

The material or compound satisfying such requirements includes Alq$_3$ for green, or, for blue, Balq (8-hydroxyquinoline beryllium salt), DPVBi (4,4'-bis(2,2-diphenylethenyl)-1,1'-biphenyl), spiro material, spiro-DPVBi (Spiro-4,4'-bis(2,2-diphenylethenyl)-1,1'-biphenyl), LiPBO (2-(2-benzoxazoyl)-phenollithium salt), bis (diphenylvinylphenylvinyl)benzene, aluminum-quinoline metal complex, imidazole, thiazole and oxazole metal complexes. To increase blue luminous efficiency, a small amount of perylene or BczVBi (3,3'[(1,1'-biphenyl)-4,4'-diyldi-2,1-ethenediyl]bis(9-ethyl)-9H-carbazole; DSA(distrylamine)) may be doped. For red, a green light emitting material may be doped with a small amount of a material such as DCJTB ([2-(1,1-dimethylethyl)-6-[2-(2,3,6,7-tetrahydro-1,1,7,7-tetramethyl-1H,5H-benzo(ij)quinolizin-9-yl)ethenyl]-4H-pyran-4-ylidene]-propanedinitrile).

When the light emitting layer is formed using inkjet printing, roll coating or spin coating, a polymer such as polyphenylenevinylene (PPV) or polyfluorene may be used for the organic light emitting layer.

The electron transport layer is positioned on the organic light emitting layer. The electron transport layer is made of a material having high electron injection efficiency from the cathode positioned thereon and enabling efficient transport of the injected electrons. To this end, useful is a material having high electron affinity, high electron transfer rate and superior electron stability.

Specific examples of the electron transport material satisfying such requirements include, but are not limited to, Al complexes of 8-hydroxyquinoline; complexes including Alq$_3$; organic radical compounds; and hydroxyflavon-metal complexes.

The electron injection layer is stacked on the electron transport layer. The electron injection layer may be manufactured using a metal complex compound such as Balq, Alq$_3$, Be(bq)$_2$, Zn(BTZ)$_2$, Zn(phq)$_2$, PBD, spiro-PBD, TPBI or Tf-6P, and a low-molecular-weight material including an aromatic compound having an imidazole ring or a boron compound. As such, the electron injection layer may be formed in the thickness range of 100~300 Å.

The cathode is positioned on the electron injection layer. The cathode functions to inject electrons. The material for the cathode may include the material as in the anode material, and a metal having a low work function to achieve efficient electron injection may be used. Especially, an appropriate metal such as tin, magnesium, indium, calcium, sodium, lithium, aluminum, or silver, or an appropriate alloy thereof may be used. Also, useful is a 100 μm or less thick electrode having a two-layer structure including lithium fluoride and aluminum, lithium oxide and aluminum, or strontium oxide and aluminum.

Illustratively, the cathode according to an embodiment of the present invention may be formed of Mg—Ag, and Ag may be used in an amount of about 5~15 wt % based on the cathode.

Illustratively, when the organic layers are patterned for R, G and B pixels, the capping layer may be formed in common to the R, G and B pixels.

Also, when the organic layers are patterned for R, G and B pixels, the capping layer may include at least one of a capping layer R formed on a region corresponding to the R pixel, a capping layer G formed on a region corresponding to the G pixel, and a capping layer B formed on a region corresponding to the B pixel, for R, G and B pixels of the organic layers.

The OLED according to an embodiment of the present invention may be a front-side emission type, a back-side emission type or a double-sided emission type, depending on the kind of material for use therein.

Meanwhile, an embodiment of the present invention addresses a terminal including a display device including the organic electronic element as above, and a controller for driving the display device. This terminal indicates a wired/wireless communication terminal which may be utilized currently or in future. The terminal according to the present invention may be a mobile communication terminal such as a mobile phone, and may include all terminals such as PDAs, electronic dictionaries, PMPs, remote controllers, navigation systems, game machines, TVs, and computers.

In order to evaluate the characteristics of the element including the capping layer using the compound according to an embodiment of the present invention, the following testing was performed.

Evaluation of Manufacture of Organic Electronic Element

Below is a description of preparation examples of OLEDs including a pair of electrodes of an anode and a cathode and a capping layer formed on the Mg:Ag cathode using a compound of Chemical Formula 1. Because there are a large number of OLEDs including the pair of electrodes of an anode and a cathode and the capping layer formed of the compound of Chemical Formula 1 on the Mg:Ag cathode, some of them are illustratively described. Moreover, OLEDs including the compounds of Chemical Formula 1 that are not illustrated but are incorporated in the present invention may be manufactured through the following preparation examples by persons having ordinary knowledge in the art, namely, those skilled in the art.

TEST EXAMPLE 1

Blue OLED

An OLED was manufactured by preparing an ITO reflective film including Ag on a glass substrate with a size of 10 mm×10 mm×1 mm; sequentially depositing a 60 nm thick hole injection layer (2-TNATA: 4,4',4"-tris(N-2(2-naphthyl)-N-phenyl-amino)triphenylamine), a 30 nm thick hole transport layer (NPB: 4,4'-bis[N-(1-naphthyl)-N-phenylamino]biphenyl), a 45 nm thick light emitting layer doped with 7% BD-052X (available from Idemitus) (where BD-052X is a blue fluorescent dopant, and a light emitting host material is 9,10-di(naphthalene-2-anthracene (AND)), a 25 nm thick electron transport layer ($Alq_3$: tris(8-quinolinolato)aluminum), a 1 nm thick electron injection layer (LiF) and a 150 nm thick aluminum cathode; and depositing a carbazole derivative according to the present invention to a thickness of 60 nm to form a capping layer.

TEST EXAMPLE 2

Green OLED

An OLED was manufactured by preparing an ITO reflective film including Ag on a glass substrate with a size of 10 mm×10 mm×1 mm; sequentially depositing a 60 nm thick hole injection layer (2-TNATA: 4,4',4"-tris(N-2(2-naphthyl)-N-phenyl-amino)triphenylamine), a 30 nm thick hole transport layer (NPB: 4,4'-bis[N-(1-naphthyl)-N-phenylamino]biphenyl), a 45 nm thick light emitting layer doped with $Alq_3$ and C-545T (C-545T: 2,3,6,7-tetrahydro-1,1,7,7-tetramethyl-1H,5H,11H-10-(2-benzothiazolyl)quinolizino-[9,9a,1gh]coumarine), a 25 nm thick electron transport layer ($Alq_3$: tris(8-quinolinolato)aluminum), a 1 nm thick electron injection layer (LiF) and a 150 nm thick aluminum cathode; and depositing a carbazole derivative according to the present invention to a thickness of 60 nm to form a capping layer.

TEST EXAMPLE 3

Red OLED

An OLED was manufactured by preparing an ITO reflective film including Ag on a glass substrate with a size of 10 mm×10 mm×1 mm; sequentially depositing a 60 nm thick hole injection layer (2-TNATA: 4,4',4"-tris(N-2(2-naphthyl)-N-phenyl-amino)triphenylamine), a 30 nm thick hole transport layer (NPB: 4,4'-bis[N-(1-naphthyl)-N-phenylamino]biphenyl), a 45 nm thick light emitting layer doped with $Alq_3$ and DCJTB (DCJTB: (E)-2-(2-t-butyl-6-(2-(1,1,7,7-tetramethyl-1,2,3,5,6,7-hexahydropyrido[3,2,1-ij]quinolin-9-yl)vinyl)-4H-pyran-4-yldiene)malononitrile), a 25 nm thick electron transport layer ($Alq_3$: tris(8-quinolinolato)aluminum), a 1 nm thick electron injection layer (LiF) and a 150 nm thick aluminum cathode; and depositing a carbazole derivative according to the present invention to a thickness of 60 nm to form a capping layer.

COMPARATIVE EXAMPLE 1

Blue OLED

An OLED was manufactured by preparing an ITO reflective film including Ag on a glass substrate with a size of 10 mm×10 mm×1 mm; sequentially depositing a 60 nm thick hole injection layer (2-TNATA: 4,4',4"-tris(N-2(2-naphthyl)-N-phenyl-amino)triphenylamine), a 30 nm thick hole transport layer (NPB: 4,4'-bis[N-(1-naphthyl)-N-phenylamino]biphenyl), a 45 nm thick light emitting layer doped with 7% BD-052X (available from Idemitus) (where BD-052X is a blue fluorescent dopant, and a light emitting host material is 9,10-di(naphthalene-2-anthracene (AND)), a 25 nm thick electron transport layer ($Alq_3$: tris(8-quinolinolato)aluminum), a 1 nm thick electron injection layer (LiF)

and a 150 nm thick aluminum cathode; and depositing Alq$_3$ (tris(8-quinolinolato)aluminum) to a thickness of 60 nm to form a capping layer.

COMPARATIVE EXAMPLE 2

Green OLED

An OLED was manufactured by preparing an ITO reflective film including Ag on a glass substrate with a size of 10 mm×10 mm×1 mm; sequentially depositing a 60 nm thick hole injection layer (2-TNATA: 4,4',4"-tris(N-2(2-naphthyl)-N-phenyl-amino)triphenylamine), a 30 nm thick hole transport layer (NPB: 4,4'-bis[N-(1-naphthyl)-N-phenylamino]biphenyl), a 45 nm thick light emitting layer doped with Alq$_3$ and C-545T (C-545T: 2,3,6,7-tetrahydro-1,1,7,7-tetramethyl-1H,5H,11H-10-(2-benzothiazolyl)quinolizino-[9,9a,1gh]coumarine), a 25 nm thick electron transport layer (Alq$_3$: tris(8-quinolinolato)aluminum), a 1 nm thick electron injection layer (LiF) and a 150 nm thick aluminum cathode; and depositing Alq$_3$ (tris(8-quinolinolato)aluminum) to a thickness of 60 nm to form a capping layer.

COMPARATIVE EXAMPLE 3

Red OLED

An OLED was manufactured by preparing an ITO reflective film including Ag on a glass substrate with a size of 10 mm×10 mm×1 mm; sequentially depositing a 60 nm thick hole injection layer (2-TNATA: 4,4',4"-tris(N-2(2-naphthyl)-N-phenyl-amino)triphenylamine), a 30 nm thick hole transport layer (NPB: 4,4'-bis[N-(1-naphthyl)-N-phenylamino]biphenyl), a 45 nm thick light emitting layer doped with Alq$_3$ and DCJTB (DCJTB: (E)-2-(2-t-butyl-6-(2-(1,1,7,7-tetramethyl-1,2,3,5,6,7-hexahydropyrido[3,2,1-ij]quinolin-9-yl)vinyl)-4H-pyran-4-yldiene)malononitrile), a 25 nm thick electron transport layer (Alq$_3$: tris(8-quinolinolato)aluminum), a 1 nm thick electron injection layer (LiF) and a 150 nm thick aluminum cathode; and depositing Alq$_3$ (tris(8-quinolinolato)aluminum) to a thickness of 60 nm to form a capping layer.

COMPARATIVE EXAMPLE 4

Blue OLED

An OLED was manufactured by preparing an ITO reflective film including Ag on a glass substrate with a size of 10 mm×10 mm×1 mm; and sequentially depositing a 60 nm thick hole injection layer (2-TNATA: 4,4',4"-tris(N-2(2-naphthyl)-N-phenyl-amino)triphenylamine), a 30 nm thick hole transport layer (NPB: 4,4'-bis[N-(1-naphthyl)-N-phenylamino]biphenyl), a 45 nm thick light emitting layer doped with 7% BD-052X (available from Idemitus) (where BD-052X is a blue fluorescent dopant, and a light emitting host material is 9,10-di(naphthalene-2-anthracene (AND)), a 25 nm thick electron transport layer (Alq$_3$: tris(8-quinolinolato)aluminum), a 1 nm thick electron injection layer (LiF) and a 150 nm thick aluminum cathode, without the formation of a capping layer.

COMPARATIVE EXAMPLE 5

Green OLED

An OLED was manufactured by preparing an ITO reflective film including Ag on a glass substrate with a size of 10 mm×10 mm×1 mm; and sequentially depositing a 60 nm thick hole injection layer (2-TNATA: 4,4',4"-tris(N-2(2-naphthyl)-N-phenyl-amino)triphenylamine), a 30 nm thick hole transport layer (NPB: 4,4'-bis[N-(1-naphthyl)-N-phenylamino]biphenyl), a 45 nm thick light emitting layer doped with Alq$_3$ and C-545T (C-545T: 2,3,6,7-tetrahydro-1,1,7,7-tetramethyl-1H,5H,11H-10-(2-benzothiazolyl)quinolizino-[9,9a,1gh]coumarine), a 25 nm thick electron transport layer (Alq$_3$: tris(8-quinolinolato)aluminum), a 1 nm thick electron injection layer (LiF) and a 150 nm thick aluminum cathode, without the formation of a capping layer.

COMPARATIVE EXAMPLE 6

Red OLED

An OLED was manufactured by preparing an ITO reflective film including Ag on a glass substrate with a size of 10 mm×10 mm×1 mm; sequentially depositing a 60 nm thick hole injection layer (2-TNATA: 4,4',4"-tris(N-2(2-naphthyl)-N-phenyl-amino)triphenylamine), a 30 nm thick hole transport layer (NPB: 4,4'-bis[N-(1-naphthyl)-N-phenylamino]biphenyl), a 45 nm thick light emitting layer doped with Alq$_3$ and DCJTB (DCJTB: (E)-2-(2-t-butyl-6-(2-(1,1,7,7-tetramethyl-1,2,3,5,6,7-hexahydropyrido[3,2,1-ij]quinolin-9-yl)vinyl)-4H-pyran-4-yldiene)malononitrile), a 25 nm thick electron transport layer (Alq$_3$: tris(8-quinolinolato)aluminum), a 1 nm thick electron injection layer (LiF) and a 150 nm thick aluminum cathode; and depositing a 60 nm thick Alq$_3$ (tris(8-quinolinolato)aluminum), without the formation of a capping layer.

For the test examples according to the present invention and the comparative examples, the driving voltage, current density, luminance, lifetime and color coordinates were measured. The results are shown in Table 3 below.

TABLE 3

| Color | | Capping layer | Voltage | Current Density | Luminance (cd/m$^2$) | Efficiency | Lifetime T (90) | CIE (x, y) |
|---|---|---|---|---|---|---|---|---|
| R | C. Ex. (6) | — | 6.7 | 6.8 | 300.0 | 4.4 | 51.2 | (0.610, 0.395) |
| | C. Ex. (3) | Alq$_3$ | 6.6 | 5.3 | 300.0 | 5.6 | 58.0 | (0.610, 0.385) |
| | Test Ex. (3-1) | Compound (1-2) | 6.5 | 5.0 | 300.0 | 6.0 | 59.3 | (0.610, 0.375) |
| | Test Ex. (3-2) | Compound (2-2) | 6.6 | 5.1 | 300.0 | 5.9 | 59.8 | (0.610, 0.380) |
| | Test Ex. (3-3) | Compound (3-2) | 6.5 | 4.5 | 300.0 | 6.6 | 59.2 | (0.610, 0.370) |
| G | C. Ex. (5) | — | 6.4 | 7.3 | 300.0 | 4.1 | 60.8 | (0.340, 0.615) |
| | C. Ex. (2) | Alq$_3$ | 6.3 | 5.6 | 300.0 | 5.4 | 62.7 | (0.335, 0.610) |
| | Test Ex. (2-1) | Compound (1-2) | 6.3 | 4.9 | 300.0 | 6.1 | 61.1 | (0.325, 0.605) |

TABLE 3-continued

| Color | | Capping layer | Voltage | Current Density | Luminance (cd/m²) | Efficiency | Lifetime T (90) | CIE (x, y) |
|---|---|---|---|---|---|---|---|---|
| | Test Ex. (2-2) | Compound (2-2) | 6.4 | 5.0 | 300.0 | 6.0 | 61.9 | (0.335, 0.610) |
| | Test Ex. (2-3) | Compound (3-2) | 6.4 | 4.3 | 300.0 | 7.0 | 61.9 | (0.335, 0.600) |
| B | C. Ex. (4) | — | 6.6 | 7.5 | 300.0 | 4.7 | 57.4 | (0.150, 0.150) |
| | C. Ex. (1) | Alq$_3$ | 6.6 | 5.6 | 300.0 | 5.4 | 58.7 | (0.150, 0.145) |
| | Test Ex. (1-1) | Compound (1-2) | 6.5 | 4.9 | 300.0 | 6.2 | 59.4 | (0.150, 0.140) |
| | Test Ex. (1-2) | Compound (2-2) | 6.5 | 4.6 | 300.0 | 6.6 | 59.5 | (0.145, 0.140) |
| | Test Ex. (1-3) | Compound (3-2) | 6.5 | 4.3 | 300.0 | 7.0 | 59.0 | (0.150, 0.130) |

As is apparent from the results of Table 3, the OLEDs using the materials for OLEDs according to the present invention as the capping layer can be remarkably improved in color purity, luminous efficiency and lifetime. When comparing the elements having the capping layer with the elements having no capping layer, the capping layer can increase color purity and efficiency. When the material of the invention is used for the capping layer, the color purity, efficiency and lifetime can be considerably improved, compared to when using Alq$_3$.

Even when the compound of the present invention is applied to other organic layers of the OLED, for example, an emission auxiliary layer, an electron injection layer, an electron transport layer and a hole injection layer, the same effects can be obtained.

Although exemplary embodiments of the present invention have been described for illustrative purposes, those skilled in the art will appreciate that various modifications, additions and substitutions are possible, without departing from the scope and spirit of the invention as disclosed in the accompanying claims. Therefore, the embodiment disclosed in the present invention is intended to illustrate the scope of the technical idea of the present invention, and the scope of the present invention is not limited by the embodiment. The scope of the present invention shall be construed on the basis of the accompanying claims, and it shall be construed that all of the technical ideas included within the scope equivalent to the claims belong to the present invention.

The invention claimed is:

1. An organic electronic element, comprising:
a first electrode;
a second electrode;
one or more organic layers formed between the first electrode and the second electrode; and
a light efficiency improving layer formed on at least one of an upper side of the second electrode and a lower side of the first electrode, opposite to the side on which the organic layers are formed, wherein the light efficiency improving layer comprises a compound represented by Chemical Formula 1 below:

[Chemical Formula 1]

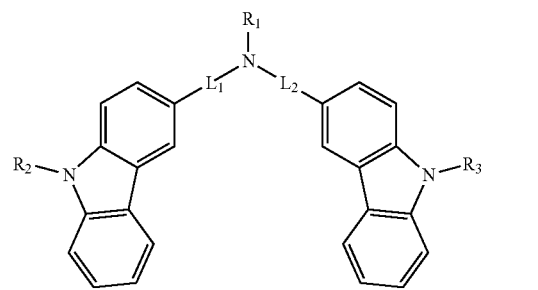

wherein (1) $R_1$, $R_2$ and $R_3$ are each independently selected from the group consisting of:
a $C_6$ to $C_{60}$ aryl group unsubstituted or substituted with one or more substituents selected from the group consisting of hydrogen, deuterium, halogen, a $C_1$ to $C_{20}$ alkyl group, a $C_1$ to $C_{20}$ alkoxy group, a $C_1$ to $C_{20}$ alkylamine group, a $C_1$ to $C_{20}$ alkylthiophene group, a $C_6$ to $C_{20}$ arylthiophene group, a $C_2$ to $C_{20}$ alkenyl group, a $C_2$ to $C_{20}$ alkynyl group, a $C_3$ to $C_{20}$ cycloalkyl group, a $C_6$ to $C_{60}$ aryl group, a deuterium-substituted $C_6$ to $C_{20}$ aryl group, a $C_8$ to $C_{20}$ arylalkenyl group, a silane group, a boron group, a germanium group, and a $C_2$ to $C_{20}$ heterocyclic group;
a $C_2$ to $C_{60}$ heterocyclic group unsubstituted or substituted with one or more substituents selected from the group consisting of hydrogen, deuterium, halogen, a $C_1$ to $C_{20}$ alkyl group, a $C_2$ to $C_{20}$ alkenyl group, a $C_1$ to $C_{20}$ alkoxy group, a $C_6$ to $C_{20}$ arylamine group, a $C_6$ to $C_{60}$ aryl group, a deuterium-substituted $C_6$ to $C_{20}$ aryl group, a $C_7$ to $C_{20}$ arylalkyl group, a $C_8$ to $C_{20}$ arylalkenyl group, a $C_2$ to $C_{20}$ heterocyclic group, a nitrile group and an acetylene group, and containing at least one of O, N, S, Si and P as a hetero atom; and
a $C_1$ to $C_{50}$ alkyl group unsubstituted or substituted with a substituent selected from the group consisting of a $C_1$ to $C_{20}$ alkyl group, a $C_2$ to $C_{20}$ alkenyl group, a $C_1$ to $C_{20}$ alkoxy group, a $C_6$ to $C_{60}$ aryl group, a $C_7$ to $C_{20}$ arylalkyl group, a $C_8$ to $C_{20}$ arylalkenyl group, a $C_2$ to $C_{20}$ heterocyclic group, a nitrile group and an acetylene group, and
(2) $L_1$ and $L_2$ are independently selected from the group consisting of a single bond; a $C_6$ to $C_{60}$ arylene group unsubstituted or substituted with one or more substituents selected from the group consisting of a nitro group, a nitrile group, halogen, a $C_1$ to $C_{20}$ alkyl group, a $C_1$ to $C_{20}$ alkoxy group and an amino group; and a $C_2$ to $C_{60}$ heterocyclic group unsubstituted or substituted with one or more substituents selected from the group consisting of deuterium, halogen, a silane group, a cyano group, a nitro group, a $C_1$ to $C_{20}$ alkoxy group, a $C_1$ to $C_{20}$ alkyl group, a $C_2$ to $C_{20}$ alkenyl group, a $C_6$ to $C_{20}$ aryl group, a deuterium-substituted a $C_6$ to $C_{20}$ aryl group, a $C_3$ to $C_{20}$ cycloalkyl group, a $C_7$ to $C_{20}$ arylalkyl group and a $C_8$ to $C_{20}$ arylalkenyl group, and containing at least one of O, N, S, Si and P as a hetero atom.

2. The organic electronic element of claim 1, wherein the compound represented by Chemical Formula 1 is any one selected from the group consisting of Chemical Formulas 2 to 4 below:

[Chemical Formula 2]

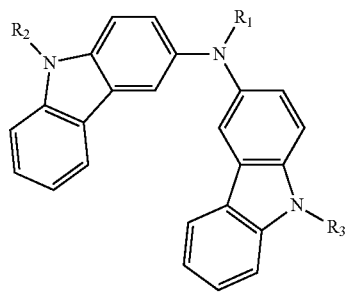

[Chemical Formula 3]

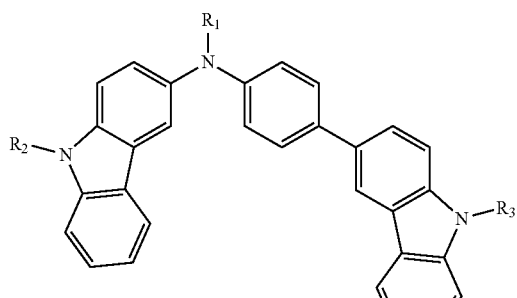

[Chemical Formula 4]

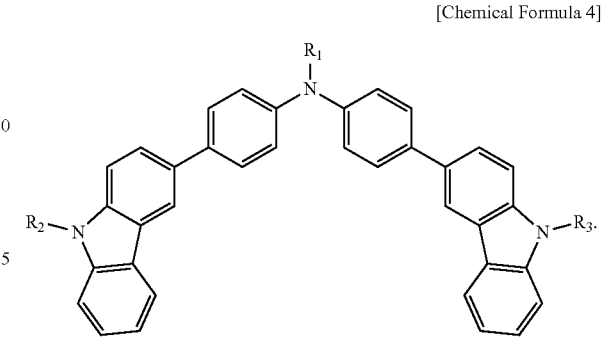

3. The organic electronic element of claim 1, wherein the compound represented by Chemical Formula 1 is any one selected from the group consisting of the following compounds:

1-1

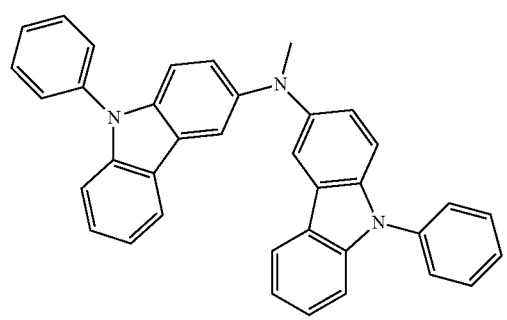

1-2

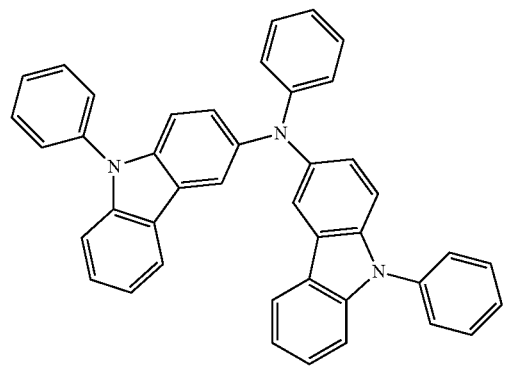

1-3

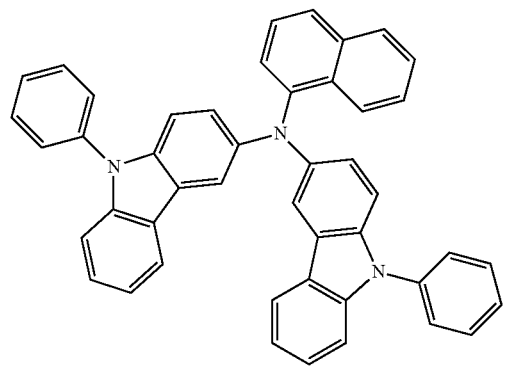

1-4

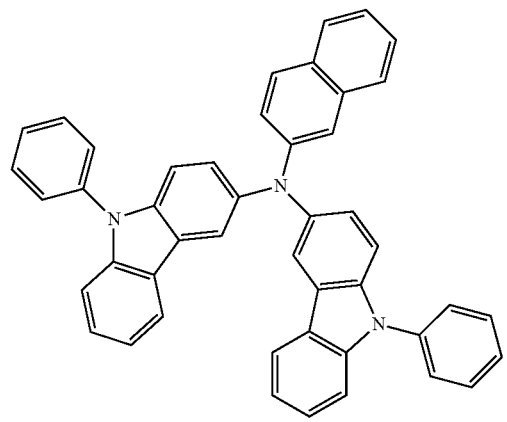

-continued
1-5
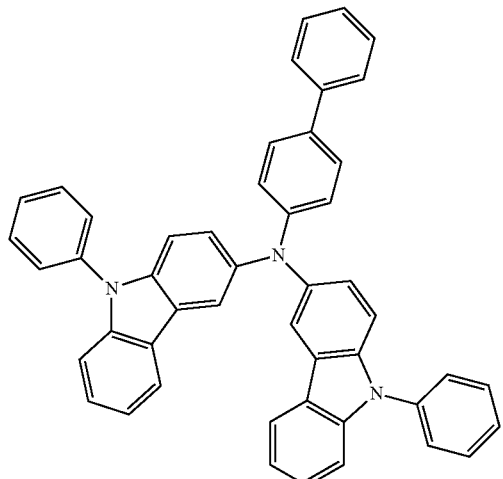
1-6
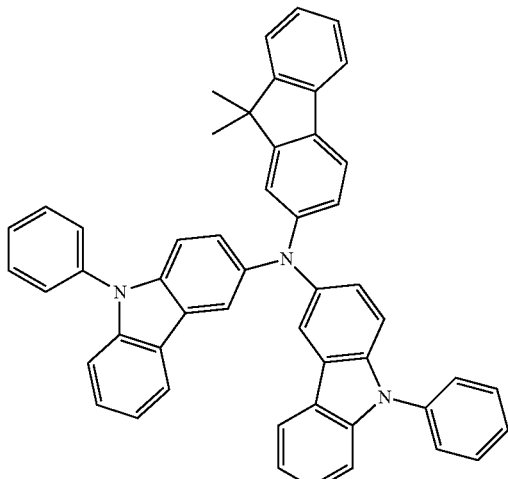
1-7
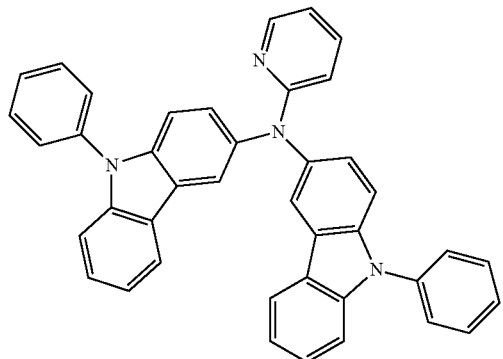
1-8
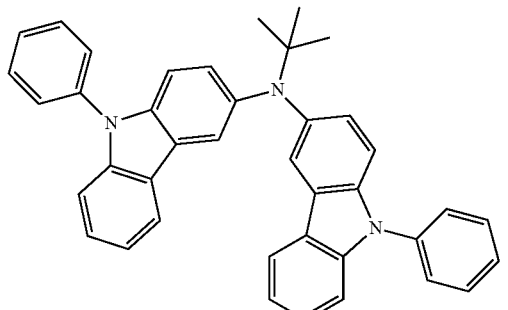
1-9
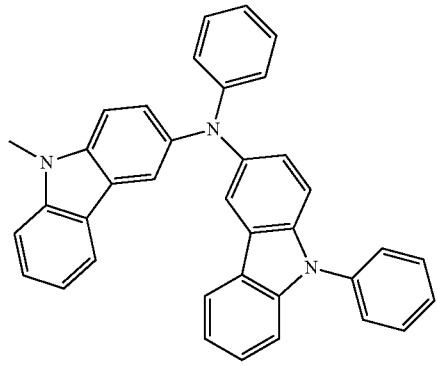
1-10
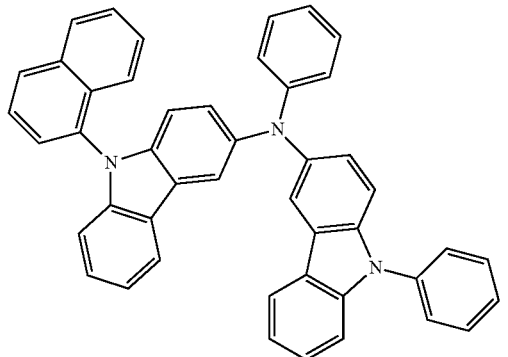
1-11
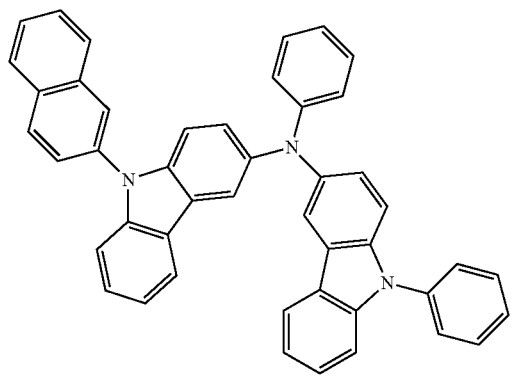
1-12
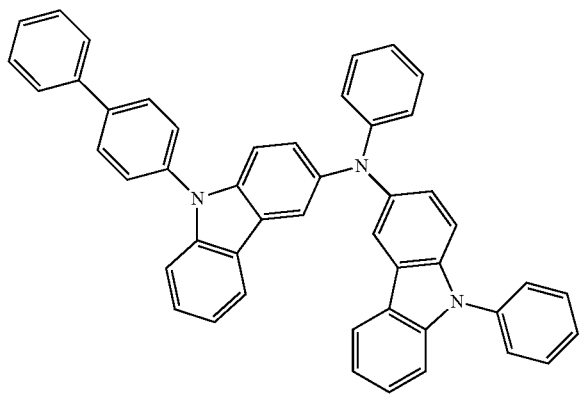

-continued
1-13
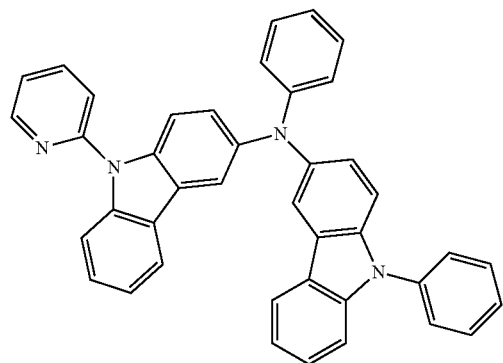
1-14
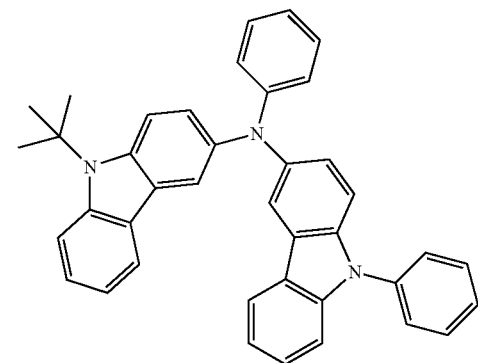
1-15
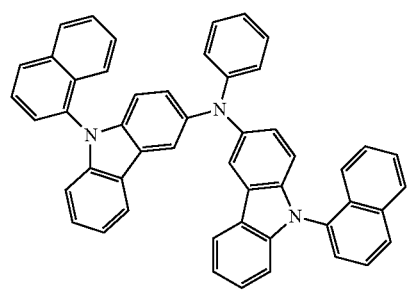
1-16
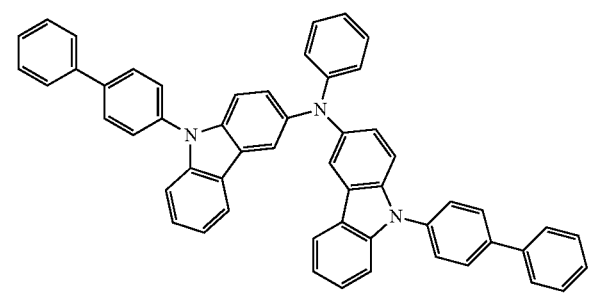
2-1
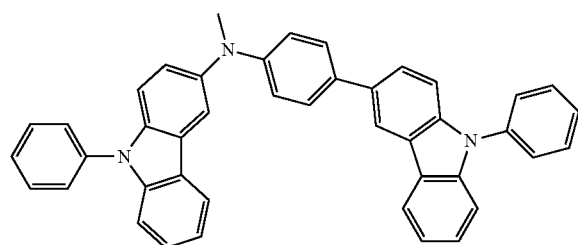
2-2
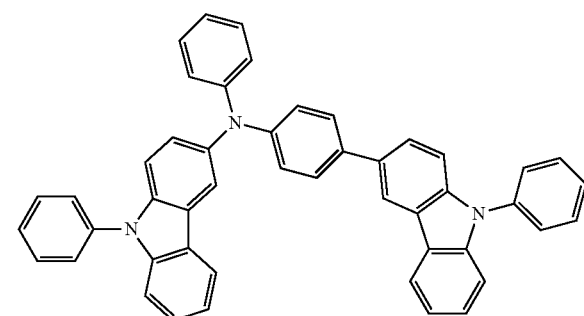
2-3
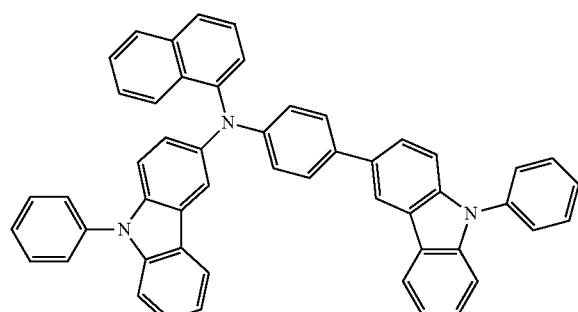
2-4
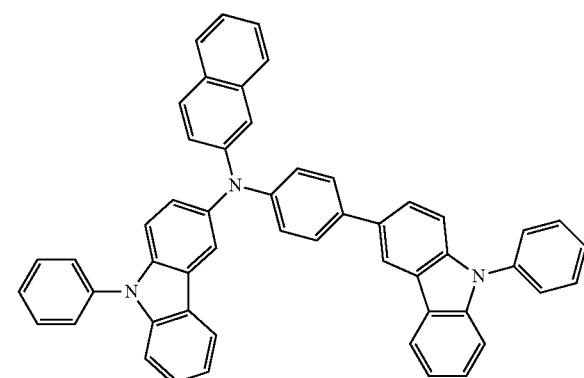

-continued
2-5
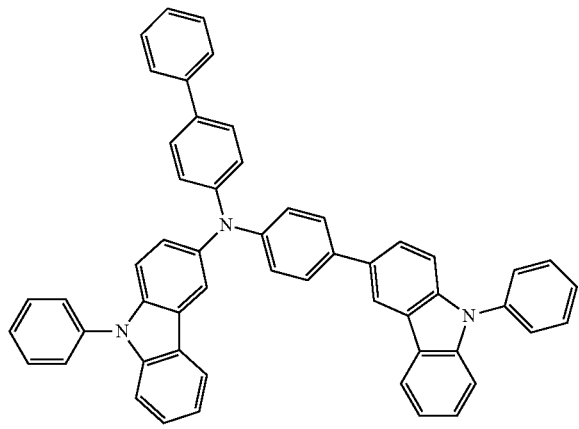
2-6
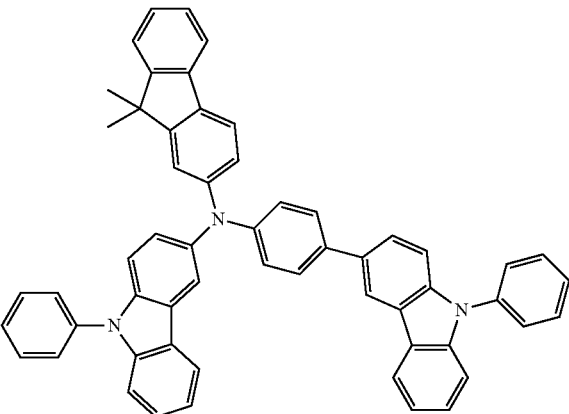
2-7
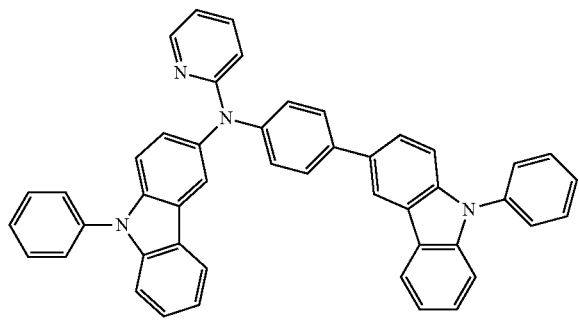
2-8
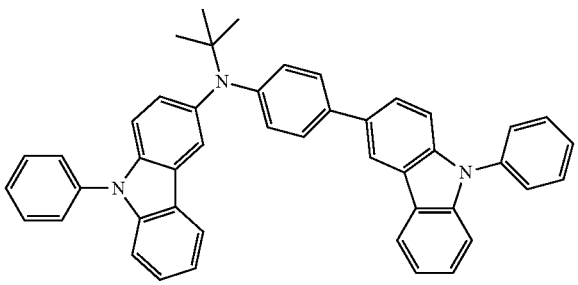
2-9
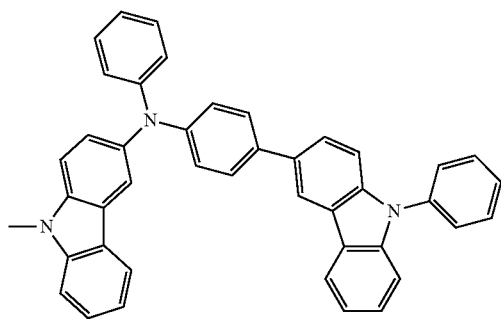
2-10
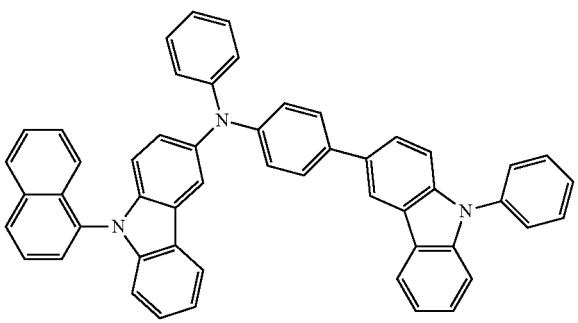
2-11
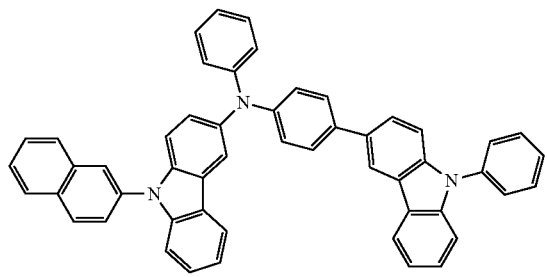
2-12
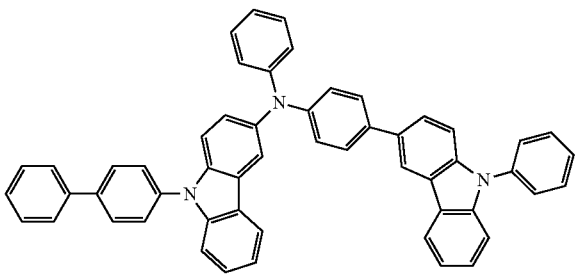

2-13 2-14
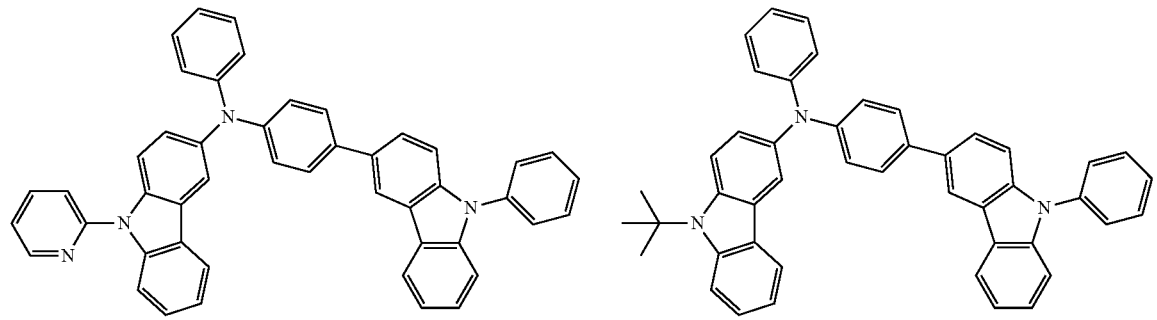
2-15 2-16
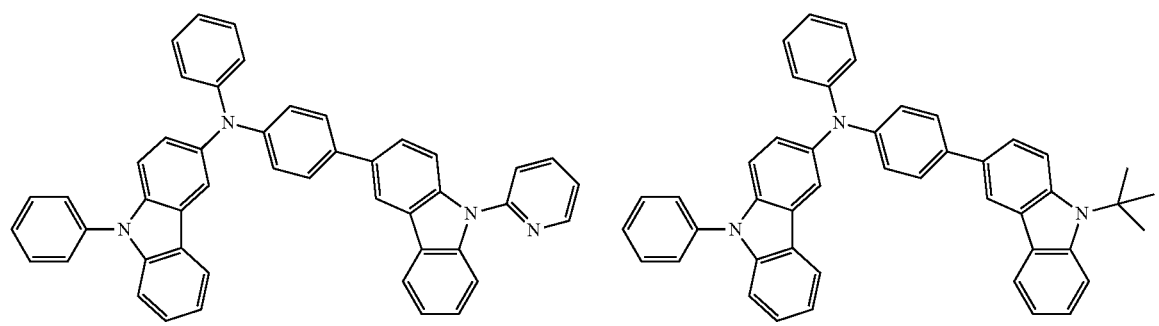
3-1 3-2
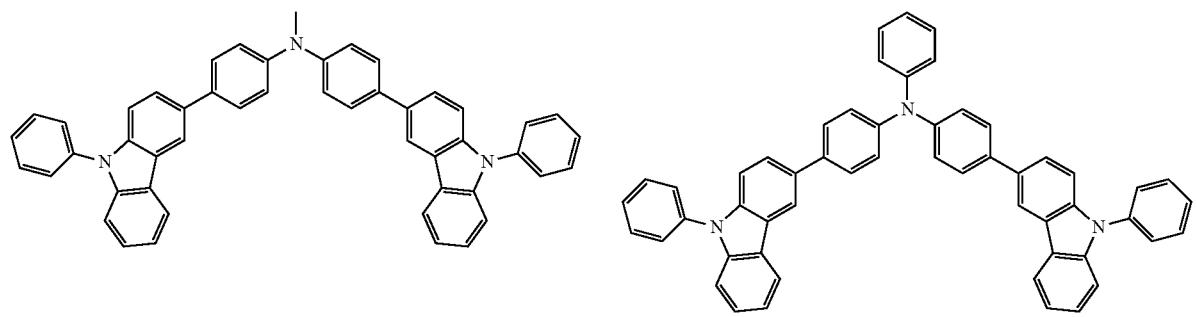
3-3 3-4
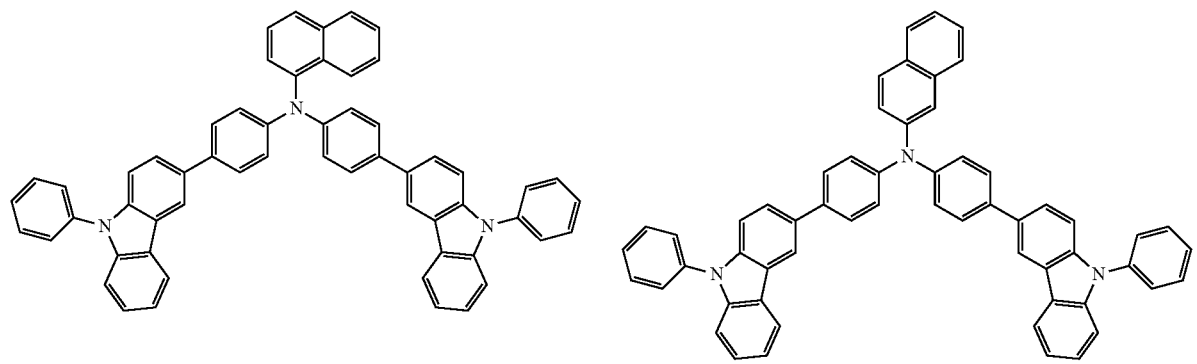

-continued
3-5
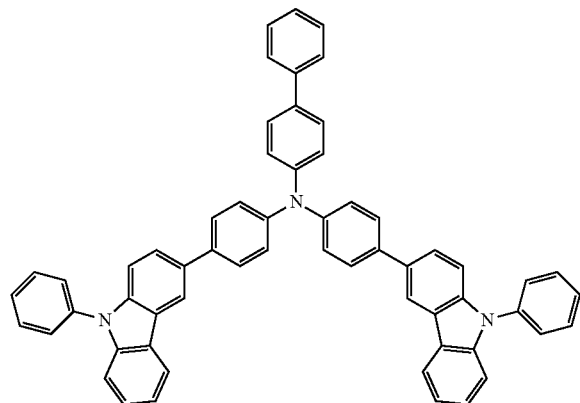
3-6
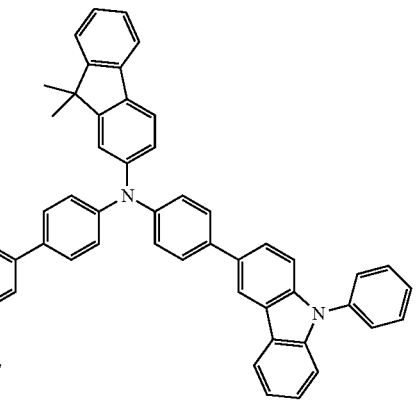
3-7
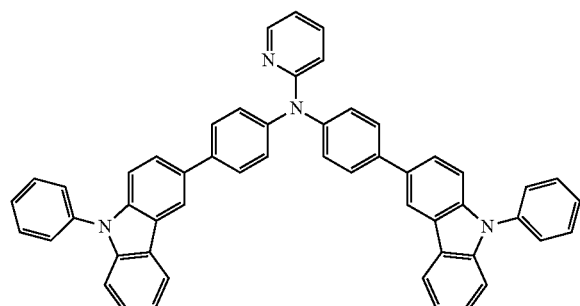
3-8
3-9
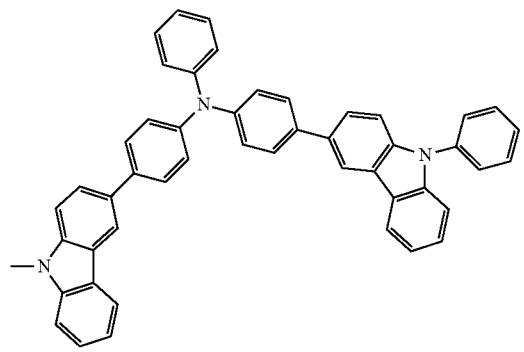
3-10
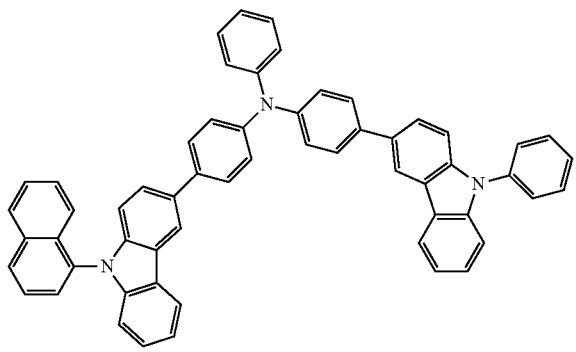
3-11
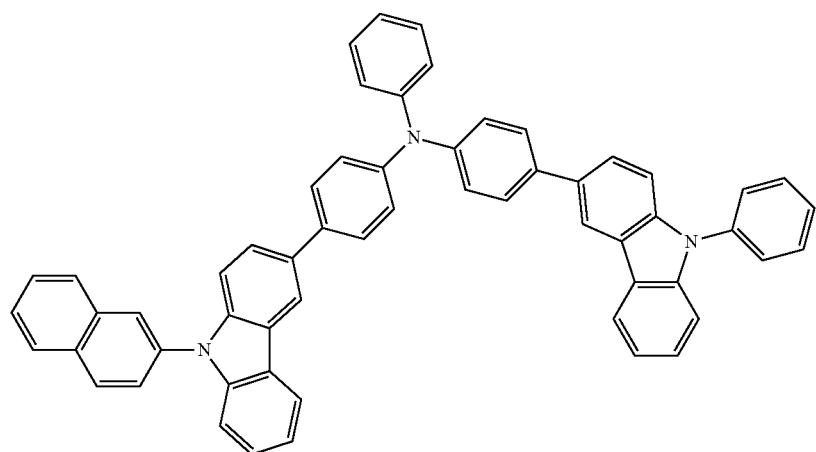

3-12

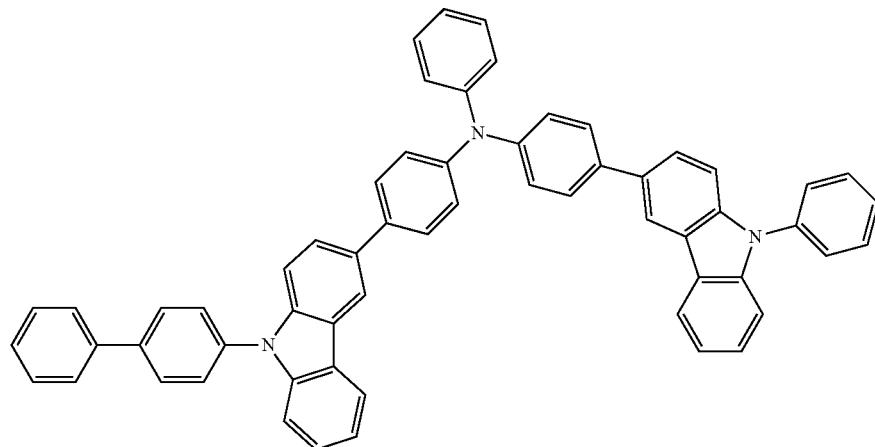

3-13 3-14

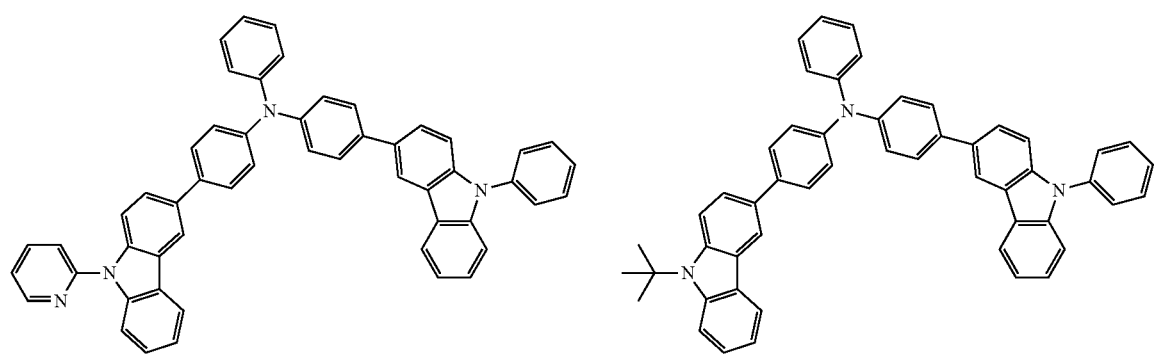

3-15 3-16

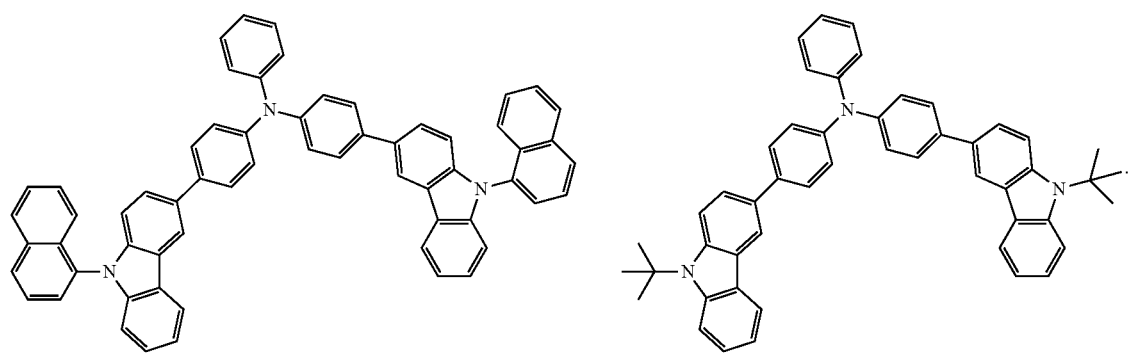

4. The organic electronic element of claim 1, wherein the first electrode is an anode formed of indium tin oxide (ITO) and Ag, the second electrode is a cathode including Mg—Ag, and the light efficiency improving layer is formed on the upper side of the second electrode.

5. The organic electronic element of claim 1, wherein the second electrode is a light transmissive cathode, and the light efficiency improving layer is formed on the upper side of the second electrode.

6. The organic electronic element of claim 1, wherein the first electrode is a light transmissive anode, and the light efficiency improving layer is formed on the lower side of the first electrode.

7. The organic electronic element of claim 1, wherein the organic layers are patterned for R, G and B pixels, and the light efficiency improving layer is formed in common to the R, G and B pixels.

8. The organic electronic element of claim 1, wherein the organic layers are patterned for R, G and B pixels; and the light efficiency improving layer includes at least one of a light efficiency improving layer-R formed on a region corresponding to the R pixel, a light efficiency improving layer-G formed on a region corresponding to the G pixel, and a light efficiency improving layer-B formed on a region corresponding to the B pixel, for the R, G and B pixels of the organic layers.

9. An electronic device, comprising a display device including the organic electronic element of claim 1; and a controller for driving the display device.

10. The electronic device of claim 9, wherein the organic electronic element is any one selected from the group consisting of an organic light emitting diode (OLED), an organic solar cell, an organic photoconductor (OPC), and an organic transistor (organic TFT).

* * * * *